US012176263B2

United States Patent
Haba et al.

(10) Patent No.: US 12,176,263 B2
(45) Date of Patent: Dec. 24, 2024

(54) INTEGRATED COOLING ASSEMBLY INCLUDING COOLANT CHANNEL ON THE BACKSIDE SEMICONDUCTOR DEVICE

(71) Applicant: Adeia Semiconductor Bonding Technologies Inc, San Jose, CA (US)

(72) Inventors: Belgacem Haba, Saratoga, CA (US); Cyprian Emeka Uzoh, San Jose, CA (US); Rajesh Katkar, Milpitas, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 18/620,753

(22) Filed: Mar. 28, 2024

(65) Prior Publication Data

US 2024/0332129 A1  Oct. 3, 2024

Related U.S. Application Data

(60) Provisional application No. 63/456,415, filed on Mar. 31, 2023.

(51) Int. Cl.
*H01L 23/46* (2006.01)
*H01L 23/00* (2006.01)
(Continued)

(52) U.S. Cl.
CPC .......... *H01L 23/46* (2013.01); *H01L 23/3736* (2013.01); *H01L 23/481* (2013.01);
(Continued)

(58) Field of Classification Search
CPC ............... H01L 23/46; H01L 23/49822; H01L 23/3736; H01L 23/481; H01L 24/08; H01L 24/09
See application file for complete search history.

(56) References Cited

U.S. PATENT DOCUMENTS 4,274,479 A  6/1981 Eastman
5,309,986 A  5/1994 Itoh
(Continued)

FOREIGN PATENT DOCUMENTS

CN  109524373 A  3/2019
CN  111128976 B  10/2021
(Continued)

OTHER PUBLICATIONS

PCT Application No. PCT/US2024/022253, International Search Report and Written Opinion dated Jul. 17, 2024, 14 pages.
(Continued)

*Primary Examiner* — Alonzo Chambliss
(74) *Attorney, Agent, or Firm* — Haley Guiliano LLP

(57) ABSTRACT

The present disclosure provides for integrated cooling systems including backside power delivery and methods of manufacturing the same. An integrated cooling assembly may include a device and a cold plate. The cold plate has a first side and an opposite second side, the first side having a recessed surface, sidewalls around the recessed surface that extend downwardly therefrom to define a cavity, and a plurality of support features disposed in the cavity. The first side of the cold plate is attached to a backside of the device to define a coolant channel therebetween. The cold plate includes a substrate, a dielectric layer disposed on a first surface of the substrate, a first conductive layer disposed between the first surface and the dielectric layer, a second conductive layer disposed on a second surface of the substrate, and thru-substrate interconnects connecting the first conductive layer to the second conductive layer.

20 Claims, 9 Drawing Sheets

(51) Int. Cl.
  *H01L 23/34* (2006.01)
  *H01L 23/373* (2006.01)
  *H01L 23/48* (2006.01)
  *H01L 23/498* (2006.01)
  *H01L 23/24* (2006.01)

(52) U.S. Cl.
  CPC ........ *H01L 23/49822* (2013.01); *H01L 24/08* (2013.01); *H01L 24/09* (2013.01); *H01L 23/24* (2013.01); *H01L 2224/08225* (2013.01)

(56) References Cited

U.S. PATENT DOCUMENTS

| | | | |
|---|---|---|---|
| 5,522,452 A | 6/1996 | Mizuno et al. | |
| 5,769,154 A | 6/1998 | Adkins et al. | |
| 6,056,044 A | 5/2000 | Benson et al. | |
| 6,351,384 B1* | 2/2002 | Daikoku | F28F 13/12 361/689 |
| 6,686,532 B1 | 2/2004 | Macris | |
| 6,822,326 B2 | 11/2004 | Enquist et al. | |
| 7,289,326 B2 | 10/2007 | Heydari et al. | |
| 7,485,957 B2 | 2/2009 | Brandenburg et al. | |
| 7,511,372 B2 | 3/2009 | Chiu | |
| 7,523,617 B2 | 4/2009 | Venkatasubramanian et al. | |
| 7,622,324 B2 | 11/2009 | Enquist et al. | |
| 7,692,926 B2 | 4/2010 | Henderson et al. | |
| 7,957,137 B2 | 6/2011 | Prasher | |
| 7,978,473 B2 | 7/2011 | Campbell et al. | |
| 7,997,087 B2 | 8/2011 | Venkatasubramanian et al. | |
| 8,164,169 B2 | 4/2012 | Chrysler et al. | |
| 8,630,091 B2 | 1/2014 | Ward et al. | |
| 9,224,673 B2 | 12/2015 | Chen et al. | |
| 9,299,641 B2 | 3/2016 | Sekar et al. | |
| 9,355,932 B2 | 5/2016 | Ankireddi et al. | |
| 9,391,143 B2 | 7/2016 | Tong et al. | |
| 9,553,071 B1 | 1/2017 | Haba | |
| 9,741,638 B2 | 8/2017 | Hsieh et al. | |
| 9,741,696 B2 | 8/2017 | Katkar et al. | |
| 9,746,248 B2 | 8/2017 | Semenov et al. | |
| 9,768,149 B2 | 9/2017 | Vadhavkar et al. | |
| 9,818,723 B2 | 11/2017 | Haba | |
| 10,032,695 B2 | 7/2018 | Iyengar et al. | |
| 10,083,934 B2 | 9/2018 | Haba | |
| 10,157,818 B2 | 12/2018 | Chen et al. | |
| 10,170,392 B2 | 1/2019 | Chainer et al. | |
| 10,199,356 B2 | 2/2019 | Kinsley | |
| 10,312,221 B1 | 6/2019 | Agarwal et al. | |
| 10,332,823 B2 | 6/2019 | Chen et al. | |
| 10,461,059 B2 | 10/2019 | Koopmans et al. | |
| 10,694,641 B2 | 6/2020 | Basu et al. | |
| 10,978,427 B2 | 4/2021 | Li et al. | |
| 11,187,469 B2 | 11/2021 | Karesh | |
| 11,387,164 B2 | 7/2022 | Wu et al. | |
| 11,598,594 B2 | 3/2023 | Lewis et al. | |
| 11,996,351 B2 | 5/2024 | Hsiao et al. | |
| 2003/0157782 A1 | 8/2003 | Kellar et al. | |
| 2004/0184237 A1 | 9/2004 | Chang | |
| 2004/0251530 A1 | 12/2004 | Yamaji | |
| 2005/0126766 A1 | 6/2005 | Lee et al. | |
| 2005/0213301 A1 | 9/2005 | Prasher | |
| 2006/0042825 A1 | 3/2006 | Lu et al. | |
| 2006/0103011 A1* | 5/2006 | Andry | H01L 25/0657 257/E23.098 |
| 2007/0025082 A1 | 2/2007 | Lee et al. | |
| 2007/0107875 A1 | 5/2007 | Lee et al. | |
| 2008/0096320 A1 | 4/2008 | Farrar | |
| 2009/0122491 A1 | 5/2009 | Martin et al. | |
| 2010/0116534 A1 | 5/2010 | Choi et al. | |
| 2010/0230805 A1 | 9/2010 | Refai-Ahmed | |
| 2010/0300202 A1 | 12/2010 | Joyce | |
| 2011/0129986 A1 | 6/2011 | Libralesso et al. | |
| 2013/0044431 A1 | 2/2013 | Koeneman | |
| 2013/0050944 A1 | 2/2013 | Shepard | |
| 2013/0087904 A1 | 4/2013 | Clark et al. | |
| 2014/0126150 A1 | 5/2014 | Song et al. | |
| 2015/0194363 A1 | 7/2015 | Jun et al. | |
| 2016/0276314 A1 | 9/2016 | Ching et al. | |
| 2017/0012016 A1 | 1/2017 | Joshi et al. | |
| 2017/0092565 A1 | 3/2017 | Chen et al. | |
| 2017/0103937 A1 | 4/2017 | Hsieh et al. | |
| 2018/0053730 A1 | 2/2018 | Shao et al. | |
| 2018/0087842 A1 | 3/2018 | Chainer et al. | |
| 2018/0090427 A1 | 3/2018 | Bernstein et al. | |
| 2018/0160565 A1 | 6/2018 | Parida | |
| 2018/0211900 A1 | 7/2018 | Gutala et al. | |
| 2018/0308783 A1 | 10/2018 | Refai-Ahmed et al. | |
| 2019/0008071 A1 | 1/2019 | Kim | |
| 2019/0355706 A1 | 11/2019 | Enquist et al. | |
| 2019/0385928 A1 | 12/2019 | Leobandung | |
| 2020/0035583 A1 | 1/2020 | Beauchemin et al. | |
| 2020/0105639 A1 | 4/2020 | Valavala et al. | |
| 2020/0312742 A1 | 10/2020 | Lofgreen et al. | |
| 2020/0343160 A1 | 10/2020 | Mizerak et al. | |
| 2020/0350233 A1 | 11/2020 | Mizerak et al. | |
| 2020/0352053 A1 | 11/2020 | Mizerak et al. | |
| 2020/0395313 A1 | 12/2020 | Mallik et al. | |
| 2021/0066164 A1 | 3/2021 | Wu et al. | |
| 2021/0175143 A1 | 6/2021 | Yu et al. | |
| 2021/0183741 A1 | 6/2021 | Jha et al. | |
| 2021/0193548 A1 | 6/2021 | Wan et al. | |
| 2021/0193620 A1 | 6/2021 | Refai-Ahmed et al. | |
| 2021/0280497 A1 | 9/2021 | Brun et al. | |
| 2021/0288037 A1 | 9/2021 | Tao et al. | |
| 2021/0378106 A1 | 12/2021 | Iyengar et al. | |
| 2021/0378139 A1 | 12/2021 | Rice et al. | |
| 2021/0410329 A1 | 12/2021 | Yang et al. | |
| 2022/0037231 A1 | 2/2022 | Hsiao et al. | |
| 2022/0087059 A1 | 3/2022 | Sathyamurthy et al. | |
| 2022/0117115 A1 | 4/2022 | Malouin et al. | |
| 2022/0130734 A1 | 4/2022 | Chiu et al. | |
| 2022/0189850 A1 | 6/2022 | Liff et al. | |
| 2022/0210949 A1 | 6/2022 | Edmunds et al. | |
| 2022/0230937 A1 | 7/2022 | Malouin et al. | |
| 2022/0408592 A1 | 12/2022 | Malouin et al. | |
| 2023/0048500 A1 | 2/2023 | Malouin et al. | |
| 2023/0154828 A1 | 5/2023 | Haba et al. | |
| 2023/0156959 A1 | 5/2023 | Malouin et al. | |
| 2023/0207474 A1 | 6/2023 | Uzoh et al. | |
| 2023/0245950 A1 | 8/2023 | Haba et al. | |
| 2023/0284421 A1 | 9/2023 | Malouin et al. | |
| 2023/0298969 A1 | 9/2023 | Park et al. | |
| 2024/0038633 A1* | 2/2024 | Haba | H01L 25/18 |
| 2024/0203823 A1 | 6/2024 | Uzoh et al. | |
| 2024/0222222 A1* | 7/2024 | Haba | H01L 25/0657 |
| 2024/0222226 A1* | 7/2024 | Haba | H01L 23/467 |
| 2024/0249995 A1 | 7/2024 | Haba | |
| 2024/0249998 A1 | 7/2024 | Gao et al. | |
| 2024/0266255 A1 | 8/2024 | Haba et al. | |

FOREIGN PATENT DOCUMENTS

| | | |
|---|---|---|
| CN | 115719735 A | 2/2023 |
| JP | 2000-340727 A | 12/2000 |
| KR | 10-1049508 B1 | 7/2011 |
| KR | 10-2023-0136509 A | 9/2023 |
| TW | 200834871 A | 8/2008 |
| WO | 2013/097146 A1 | 7/2013 |

OTHER PUBLICATIONS

Evan G. Colgan, "A Practical Implementation Of Silicon Microchannel Coolers", available online at <https://www.electronics-cooling.com/2007/11/a-practical-implementation-of-silicon-microchannel-coolers/>, Nov. 1, 2007, 10 pages.

Francisco Pires, "Tsmc Exploring On-Chip, Semiconductor-Integrated Watercooling", tom's Hardware, retrieved from https://www.tomshardware.com/news/tsmc-exploring-on-chip-semiconductor-integrated-watercooling, Jul. 13, 2021, 23 pages.

Ibm, "Functional electronic packaging-Thermal management roadmap", available online at <https://web.archive.org/web/20170220095511/https://www.zurich.IBM.com/st/electronicpackaging/cooling.html>, Feb. 20, 2017, 7 pages.

(56) References Cited

OTHER PUBLICATIONS

International Search Report and Written Opinion received for PCT Patent Application No. PCT/US23/28942, mailed on Nov. 16, 2023, 12 pages.

International Search Report and Written Opinion received for PCT Patent Application No. PCT/US23/84874, mailed on Apr. 22, 2024, 7 pages.

International Search Report and Written Opinion received for PCT Patent Application No. PCT/US23/85801, mailed on Apr. 26, 2024, 8 pages.

International Search Report and Written Opinion received for PCT Patent Application No. PCT/US23/85816, mailed on Apr. 23, 2024, 11 pages.

International Search Report and Written Opinion received for PCT Patent Application No. PCT/US23/86233, mailed on Apr. 26, 2024, 7 pages.

Kaplan, F et al., "LoCool: Fighting Hot Spots Locally for System Energy Efficiency" IEEE Transactions on Computer- Aided Design of Intergrated Circuits and Systems, 39(4): 895-908 (2020).

Patent Application S/N U.S. Appl. No. 18/129,567, filed Mar. 31, 2023, First Name Inventor: Cyprian Emeka Uzoh, "Embedded Cooling Systems for Device Packages and Methods of Cooling Packaged Devices".

Shamsa, M., et al., "Thermal conductivity of diamond-like carbon films", Applied Physics Letters, vol. 89, No. 16, Oct. 20, 2006, pp. 161921-161921-3.

Wu, C. J., et al., "Ultra High Power Cooling Solution for 3D-Ics", 2021 Symposium on VLSI Technology, Jun. 2021, 2 pages.

Lien, Yu-Jen, et al., "An Energy-efficient Si-integrated Micro-cooler for High Power and Power-density Computing Applications", 2024 IEEE 74th ECTC, 5 pages.

Benson D.A. et al., "Micro-Machined Heat Pipes in Silicon MCM Substrates", Sandia National Laboratories, Sandia Report: SAND97-0100-UC-704, printed Jan. 1997, 17 pages.

Colgan, Evan G., "A practical implementation of silicon microchannel coolers," Electronics Cooling, Nov. 1, 2007, http://www.electronics-cooling.com/2007/11/a-practical-implementation-of-silicon-microchannel-coolers, printed May 23, 2023, 11 pages.

Johnstone, Caitlin, "Coolant-on-Chip: Say Goodbye to Thermal Interfaces," jetcool, Jun. 9, 2020, https://jetcool.com/post/coolant-on-chip-say-goodbye-to-thermal-interfaces/, downloaded Feb. 29, 2024, 7 pages.

"KoolMicro Inc. developed the World's First 2,000 W/cm2 Cooling Technology for High Heat Generation Chips," Press Release, 2 pages, downloaded from www.semiconductorpackagingnews.com/uploads/1/KoolMicro_High_Cooling_Power_Density.pdf on Nov. 22, 2023.

"Microconvective Liquid Cooling for high power electronics," https://jetcool.com/technology/, downloaded Mar. 7, 2024, 6 pages.

"Single-Phase Direct-to-Chip Liquid Cooling," 6 pages, downloaded from https://jetcool.com/post/single-phase-direct-to-chip-liquid-cooling-microconvective-vs-microchannel-liquid-cooled-cold-plates/ on Mar. 7, 2024.

Walsh, Stephen Michael, "Microjet Impingement Cooling of High Power-Density Electronics," Thesis, submitted May 11, 2018, 93 pages.

International Search Report and Written Opinion mailed Mar. 16, 2023, in International Application No. PCT/US2022/050105, 9 pages.

International Search Report and Written Opinion mailed May 30, 2023, in International Application No. PCT/US2023/061494, 9 pages.

International Search Report and Written Opinion mailed Jun. 5, 2024, in International Application No. PCT/US2024/013758, 9 pages.

\* cited by examiner

INTEGRATED COOLING ASSEMBLY INCLUDING COOLANT CHANNEL ON THE BACKSIDE SEMICONDUCTOR DEVICE

CROSS-REFERENCE TO RELATED APPLICATIONS

This application claims priority to U.S. Provisional Application No. 63/456,415, filed on Mar. 31, 2023, which is herein incorporated by reference in its entirety.

FIELD

The present disclosure relates to advanced packaging for microelectronic devices, and in particular, embedded cooling systems including backside power delivery and methods of manufacturing the same.

BACKGROUND

As the demands in large-scale computing rise, energy consumption in conjunction with chip layout management poses a critical challenge. In particular, area on a semiconductor chip's active side, or frontside, will be increasingly reserved for various high power-density circuitries and/or other integrated circuitries. The high power-density will require a delivery network capable of supporting the increasing energy consumption without interfering with the active side. In one approach, a device may include a power/ground delivery network on the frontside. However, in this approach, power/ground delivery from the frontside may occupy valuable space that could be reserved to help address the large-scale computing demands. The delivery network in such an approach can be challenging to manufacture while meeting the large-scale computing demands such as low impedance and high computing frequency. Moreover, a frontside power/ground delivery network may compete with the extensive signal routing required to support the data traffic in large-scale computing.

In another approach, a power/ground delivery network may be disposed at the passive side or backside of the chip. However, having a power/ground delivery network at the chip's backside may interfere with the components in backside thermal dissipative systems. Thermal dissipation in high-power density chips is continuing to be a critical challenge as improvements in chip performance, e.g., through increased gate density and multi-core microprocessors, have resulted in increased power density and a corresponding increase in thermal flux that contributes to elevated chip temperatures. For example, cooling costs for large-scale computing make up a significant portion of computing center energy requirements as even small increases in operating temperatures can degrade the performance of microprocessors, memory devices, and other electronic components. An approach to power/ground delivery that interferes with a thermal dissipative system may prevent meeting the thermal budgets in large-scale computing systems and/or other computing systems.

Accordingly, there exists a need in the art for integrated cooling systems having power and/or ground delivery and methods of manufacturing the same.

SUMMARY

The present disclosure is directed to integrated cooling systems providing power/ground delivery and fluid cooling. In particular, embodiments described herein provide integrated device cooling assemblies having a power and/or ground delivery network on a different side than the active part of the device. Advantageously, the integrated device cooling assemblies reduce resistance in the thermal path and deliver power/ground to the device on the same side as the thermal dissipative system in a manner that does not interfere with the thermal pathway. In some embodiments, the thermal pathway formed by the integrated cooling assembly may be enhanced by the power/ground delivery network.

In one embodiment, an integrated cooling assembly comprises a semiconductor device and a cold plate. The cold plate may be bonded to a side of the device, defining a coolant channel therebetween. For example, the cold plate may comprise a patterned side facing the device and spaced apart from the side of the device, the patterned side having support features that define the coolant channel. The cold plate may comprise a substrate and a dielectric layer disposed on a side of the substrate.

In one embodiment, the cold plate comprises a substrate, one or more sides including a first side and a second side, and one or more thru-substrate interconnects. The first side may comprise one or more layers, for example, including a first conductive layer and a dielectric layer. The dielectric layer may be disposed on the first conductive layer and/or the substrate. The second side may comprise one or more layers, for example, including a second conductive layer. The thru-substrate interconnects may connect layers of the first side and layers of the second side. For example, the thru-substrate interconnects may electrically connect the first conductive layer of the first side and the second conductive layer of the second side. In some embodiments, the first and/or second conductive layers may comprise a metallized component and/or at least partially formed using a metallization process. For example, the first conductive layer may be formed by metallizing a side of the substrate. Such a conductive layer may be referred to as a metallization layer.

In some embodiments, the cold plate may comprise a plurality of conductive layers disposed on sides of the substrate and/or between the dielectric layer and the respective side of the substrate. The conductive layers may be disposed on opposite sides of the substrate. The cold plate may comprise thru-substrate interconnects (e.g., vias, etc.) that connect one or more conductive layers at a first side of the substrate to one or more conductive layers at a second side of the substrate. In one embodiment, the cold plate may comprise (i) a first conductive layer disposed between a first portion of a first side of the substrate and the dielectric layer, (ii) a second conductive layer disposed on a second side of the substrate, and (iii) thru-substrate interconnects connecting the first conductive layer and the second conductive layer. Additionally, the cold plate may comprise (iv) a third conductive layer disposed between a second portion of a first side of the substrate and the dielectric layer, (v) a fourth conductive layer disposed on the second side of the substrate, and (vi) second thru-substrate interconnects connecting the third conductive layer and the fourth conductive layer.

In one embodiment, an integrated cooling assembly comprises a device and a cold plate. The device has an active side and a backside disposed opposite of the active side. The cold plate may have a first side and a second side opposite the first side. The first side of the cold plate may comprise a recessed surface, sidewalls that surround the recessed surface and extend downwardly therefrom to define a cavity, and a plurality of support features disposed in the cavity. The first side of the cold plate may be attached to the device backside to define a coolant channel therebetween.

For embodiments in which the cold plate comprises two or more conductive layers on the same side of the substrate, the conductive layers on the same side may be separated from each other and arranged in various configurations. For example, the second conductive layer may be disposed over the fourth conductive layer and separated by a portion disposed therebetween. For example, the portion may comprise a dielectric or an insulating material. In a non-limiting example, a first portion of the first conductive layer and a second portion of the third conductive layer may be laterally adjacent, the first and second portions separated by a portion of the dielectric layer.

In some embodiments, the cold plate may comprise a substrate, a dielectric layer disposed on the substrate, a first conductive layer disposed between a side of the substrate and the dielectric layer, a second conductive layer disposed on another side of the substrate, and thru-substrate interconnects connecting the first conductive layer to the second conductive layer. For example, the substrate may have a first surface on the first side of the cold plate and a second surface opposite the first surface of the substrate. The dielectric layer may be disposed on the first surface of the substrate. The first conductive layer may be disposed between the first surface and the dielectric layer. The second conductive layer may be disposed on the second surface of the substrate. In this example, the thru-substrate interconnects may extend from the first surface to the second surface to electrically connect the first conductive layer and the second conductive layer.

In some embodiments, the cold plate may comprise a first dielectric layer disposed on a first surface of a substrate, a first conductive layer disposed between at least a portion of the first surface and the first dielectric layer, a second conductive layer disposed on the first dielectric layer and over the first conductive layer, a second dielectric layer disposed on a second surface of the substrate, a third conductive layer disposed between at least a portion of the second surface and the second dielectric layer, a fourth conductive layer disposed on the second dielectric layer and over the third conductive layer, one or more first thru-substrate interconnects connecting the first conductive layer to the third conductive layer, and one or more second thru-substrate interconnects connecting the second conductive layer to the fourth conductive layer.

In some embodiments, the cold plate may comprise a first conductive layer disposed on a first portion of a second surface of the substrate, a second conductive layer disposed on a second portion of the second surface, the first conductive layer and the second conductive layer being electrically decoupled or separate from each other.

The present disclosure provides for processes of manufacturing the integrated cooling systems providing power/ground delivery and fluid cooling. In an example process, a substrate may be prepared having a first side comprising a base surface and support features. A plurality of conductive vias may be formed in the substrate, starting from a second side of the substrate and ending at the base surface. A first conductive layer is formed on the first side. A second conductive layer is formed on the second side. The first conductive layer and the second conductive are connected by the plurality of conductive vias. A dielectric layer may be deposited on the first conductive layer to form a cold plate having a patterned first side. Portions of the patterned first side are prepared for bonding. The cold plate may be bonded to a semiconductor device, electrically coupling the first conductive layer to the semiconductor device. When the cold plate is bonded to the semiconductor device, a coolant channel may be defined therebetween by spacing apart the base surface and the device side.

In one embodiment, a method of manufacturing an integrated cooling system may comprise bonding a backside of a device to a first side of the cold plate, defining a coolant channel therebetween. The cold plate may comprise a substrate, a dielectric layer disposed on the substrate, a substrate, a dielectric layer disposed on the substrate, a first conductive layer disposed between a side of the substrate and the dielectric layer, a second conductive layer disposed on another side of the substrate, and thru-substrate interconnects connecting the first conductive layer to the second conductive layer.

In one embodiment, a method of manufacturing an integrated cooling system may comprise forming a cold plate having a first side and a second side opposite the first side, the first side having a recessed surface, sidewalls that surround the recessed surface and extend downwardly therefrom to define a cavity, and a plurality of support features disposed in the cavity. Forming the cold plate may comprise preparing a substrate having a first surface on the first side and a second surface opposite the first surface, forming a dielectric layer on the first surface, forming a first conductive layer on the first surface (e.g., disposed between the first surface and the dielectric layer), forming a second conductive layer on the second surface; and forming thru-substrate interconnects connecting the first conductive layer to the second conductive layer. The method may comprise bonding the first side of the cold plate to a backside of a device to define a coolant channel therebetween.

In one embodiment, a method of manufacturing an integrated cooling system may comprise forming the cold plate and bonding the first side of the cold plate to a side of a device to define a coolant channel therebetween, wherein the bonding may include electrically coupling the first conductive layer to the device. The cold plate may have a first side and a second side opposite the first side, the first side having a recessed surface, sidewalls that surround the recessed surface and extend downwardly therefrom to define a cavity, and a plurality of support features disposed in the cavity. Forming the cold plate may comprise preparing a substrate having a first surface and a second surface opposite the first surface, forming a plurality of conductive vias in the substrate, forming the first side of the cold plate at the first surface, the first side having: a first conductive layer; and a dielectric layer on the first conductive layer. The method may comprise forming the second side of the cold plate at the second surface, the second side comprising a second conductive layer. The plurality of conductive vias may start from the second side and end at the recessed surface, and where the plurality of conductive vias electrically connect the first conductive layer and the second conductive layer.

BRIEF DESCRIPTION OF THE DRAWINGS

The above and other objects and advantages of the disclosure will be apparent upon consideration of the following detailed description, taken in conjunction with the accompanying drawings, in which.

Figure 1A:
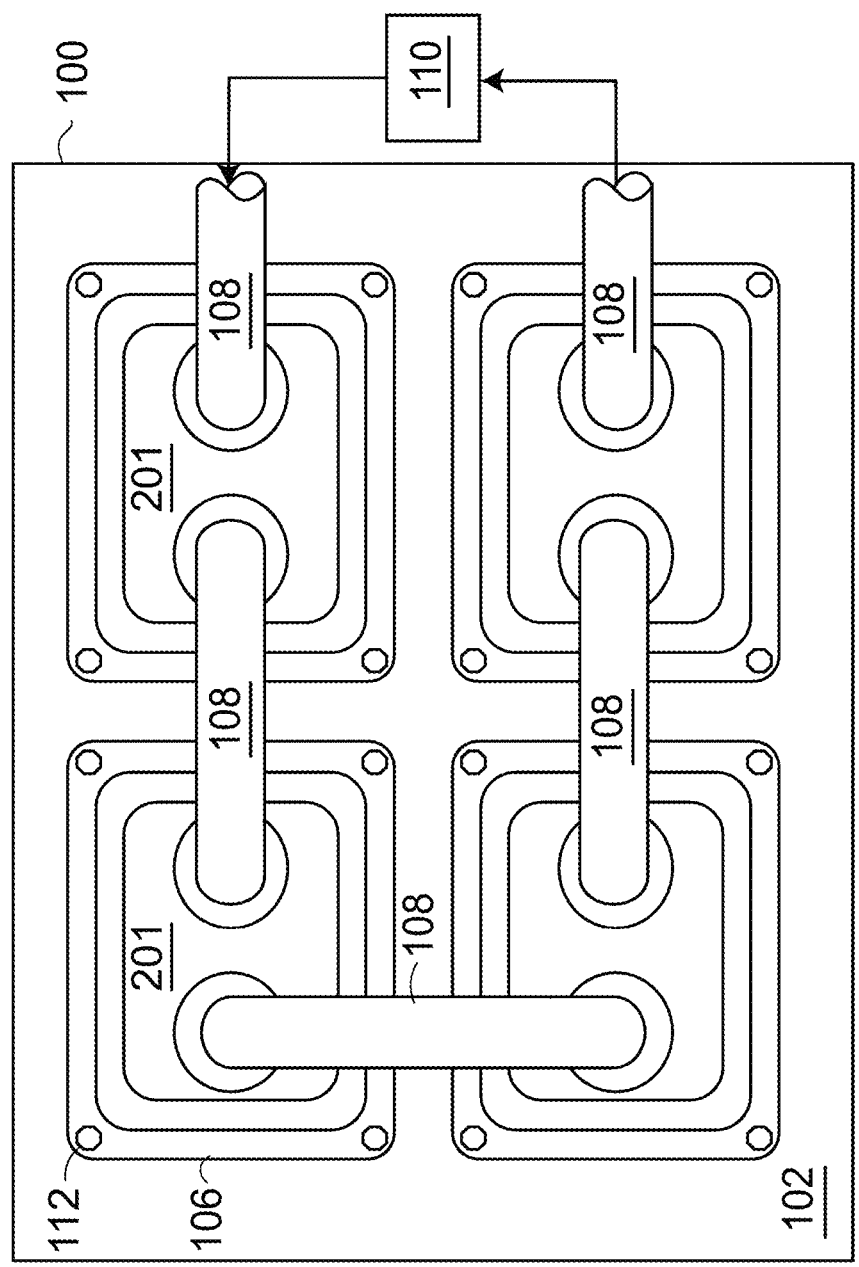
FIG. 1A is a schematic plan view of an example of a system panel, in accordance with embodiments of the present disclosure.

The figures herein depict various embodiments of the present disclosure for purposes of illustration only. It will be appreciated that additional or alternative structures, assemblies, systems, and methods may be implemented within the principles set out by the present disclosure.

DETAILED DESCRIPTION

As used herein, the term "substrate" means and includes any workpiece, wafer, or article that provides a base material or supporting surface from which or upon which components, elements, devices, assemblies, modules, systems, or features of the heat-generating devices, packaging components, and cooling assembly components described herein may be formed. The term substrate also includes "semiconductor substrates" that provide a supporting material upon which elements of a semiconductor device are fabricated or attached, and any material layers, features, and/or electronic devices formed thereon, therein, or therethrough.

As used herein, the term "layer" refers to a sheet having the same material type, wherein the sheet is disposed on a surface or side (e.g., on a substrate). As referred to herein, a layer may be formed in one or more stages belonging to the same formation process. In one general aspect, a side of a layer abuts the surface on which the layer is disposed. A layer may be conformal (e.g., shaped to abut a surface). As used herein, a layer may refer to a plurality of regions of the same material type disposed on a surface. For example, a layer may have been patterned into individual parts or regions. In particular, although a layer may be shown in a sectional side view as separate parts adjoining an object, a layer may refer to a continuous sheet of the same material type having contiguous regions around the object (e.g., as shown from a top-down view).

As described below, the semiconductor substrates herein generally have a "device side," e.g., the side on which semiconductor device elements are fabricated, such as transistors, resistors, and capacitors, and a "backside" that is opposite the device side. The term "active side" should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that form the active side may change depending on the stage of device fabrication and assembly. Similarly, the term "non-active side" (opposite the active side) includes the non-active side of the substrate at any stage of device fabrication, including the surfaces of any material layer, any feature formed thereon, or extending outwardly therefrom, and/or any openings formed therein. Thus, the terms "active side" or "non-active side" may include the respective surfaces of the semiconductor substrate at the beginning of device fabrication and any surfaces formed during material removal, e.g., after substrate thinning operations. Depending on the stage of device fabrication or assembly, the terms "active" and "non-active sides" are also used to describe surfaces of material layers or features formed on, in, or through the semiconductor substrate, whether or not the material layers or features are ultimately present in the fabricated or assembled device.

Spatially relative terms are used herein to describe the relationships between elements, such as the relationships between substrates, heat-generating devices, cooling assembly components, device packaging components, and other features described below. Unless the relationship is otherwise defined, terms such as "above," "over," "upper," "upwardly," "outwardly," "on," "below," "under," "beneath," "lower," and the like are generally made with reference to the X, Y, and Z directions set forth in the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as "disposed on," "embedded in," "coupled to," "connected by," "attached to," "bonded to," either alone or in combination with a spatially relevant term include both relationships with intervening elements and direct relationships where there are no intervening elements.

Unless otherwise noted, the term "cold plate" generally refers to a base plate, or a stack of base plates directly bonded to one another, which may be bonded to the semiconductor device. The cold plate may include material layers and/or metal features formed on or in a surface of the base plate or stack of base plates that facilitate direct dielectric or hybrid bonding with a semiconductor device. The term "integrated cooling assembly" (ICA) generally refers to a cold plate attached to a semiconductor device so as to form a single piece, such as by use of the direct bonding methods described below. The direct bonding methods enable heat from the semiconductor device to be directly transferred to a coolant fluid flowed between the cold plate and the semiconductor device. Unless otherwise noted, the device packages and cold plates described herein may be used with any selected fluid coolant, e.g., liquid, gas, and/or vapor-phase coolants. Thus, the terms should not be construed as limiting the coolant to any one fluid phase.

FIG. 1A is a schematic plan view of an example of a system panel 100, in accordance with embodiments of the present disclosure. Generally, the system panel 100 includes a printed circuit board, here PCB 102, a plurality of device packages 201 mounted to the PCB 102, and a plurality of coolant lines 108 fluidly coupling each of the device packages 201 and to a coolant source 110. It is contemplated that coolant may be delivered to each of the device packages 201 in any desired fluid phase, e.g., liquid, vapor, gas, or combinations thereof and may flow out from the device package 201 in the same phase or a different phase. In some embodiments, the coolant is delivered to the device package 201 and returned therefrom as a liquid and the coolant source 110 may comprise a heat exchanger or chiller to maintain the coolant at a selected temperature. In other embodiments, the coolant may be delivered to the device packages 201 as a liquid, vaporized to a liquid within the device package, and returned to the coolant source 110 as a vapor. In those embodiments, the device packages 201 may be fluidly coupled to the coolant source 110 in parallel and the coolant source 110 may include or further include a compressor (not shown) for condensing the received vapor to a liquid form.

Figure 1B:
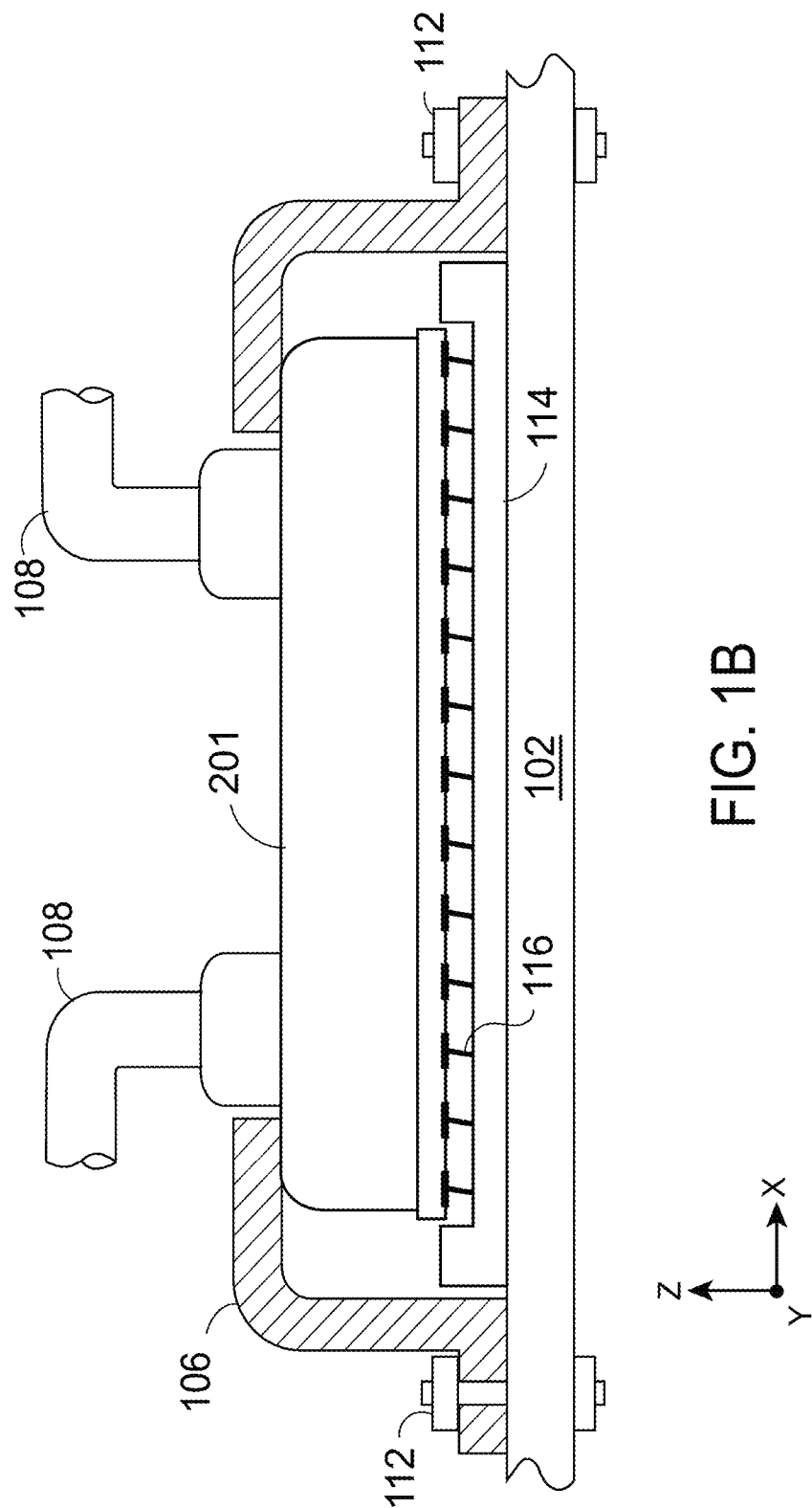
FIG. 1B is a schematic partial sectional side view of a device package mounted on a PCB, in accordance with embodiments of the present disclosure.

FIG. 1B is a schematic partial sectional side view of a portion of the system panel 100 of FIG. 1. As shown, each device package 201 is disposed in a socket 114 of the PCB 102 and connected thereto using a plurality of pins 116, or by other suitable connection methods, such as solder bumps (not shown). The device package 201 may be seated in the socket 114 and secured to the PCB 102 using a mounting frame 106 and a plurality of fasteners 112, e.g., compression screws, collectively configured to exert a relatively uniform downward force on the upward facing edges of the device package 201. The uniform downward force ensures proper pin contact between the device package 201 and the socket 114.

Figure 2A:
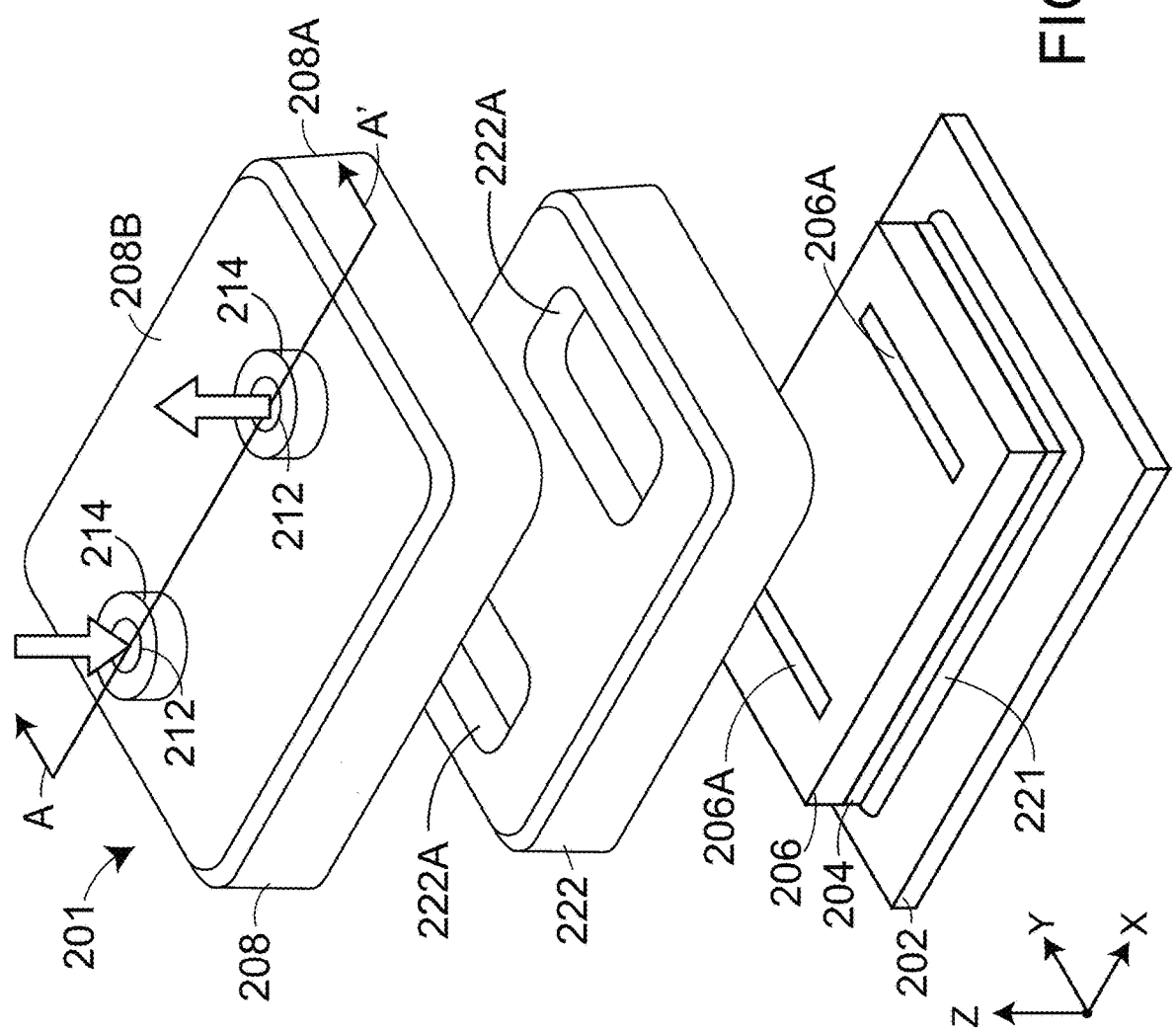
FIG. 2A is a schematic exploded isometric view of the device package in FIG. 1B.
Figure 2B:
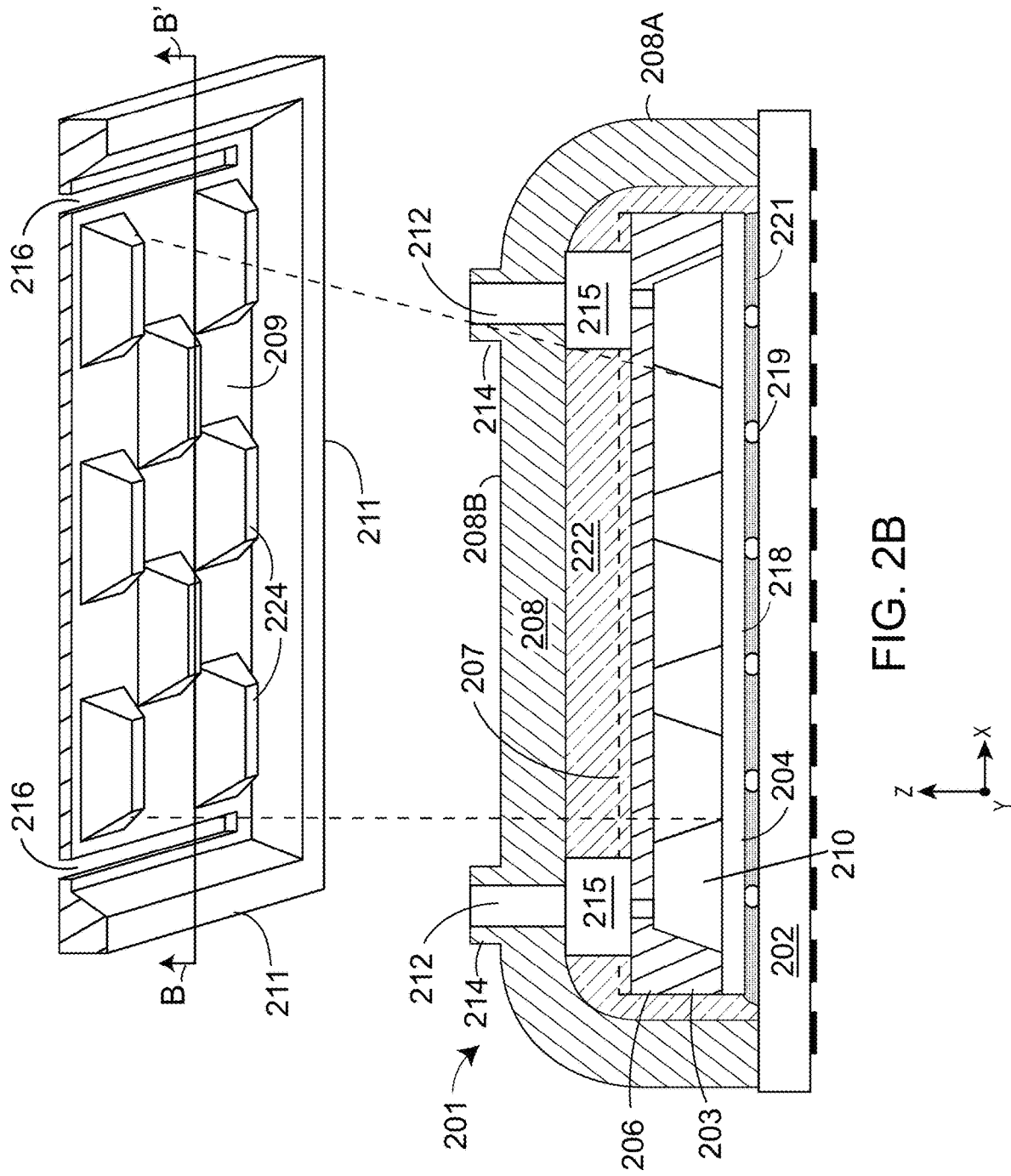
FIG. 2B is a schematic sectional view of the device package of FIG. 1B.

FIG. 2A is a schematic exploded isometric view of an example device package 201, in accordance with embodiments of the present disclosure. FIG. 2B is a schematic sectional view of the device package 201 taken along line A-A' of FIG. 2A. Generally, the device package 201 includes a package substrate 202, an ICA 203 (as shown in FIG. 2B) disposed on the package substrate 202, and a package cover 208 disposed on a peripheral portion of the package substrate 202. The package cover 208 extends over the ICA 203 so that the ICA 203 is disposed between the package substrate 202 and the package cover 208. As shown, the device package 201 further includes a sealing material layer 222 that forms a coolant impermeable barrier between the package cover 208 to the ICA 203. Coolant is delivered to the ICA 203 via inlet/outlet openings 212 in the package cover 208 and corresponding openings 222A formed through the sealing material layer 222. In some embodiments, the device package 201 may further include a support member 207 (shown in phantom in FIG. 2B) attached to the ICA 203.

Generally, the package substrate 202 includes a rigid material, such as an epoxy or resin-based laminate, that supports the ICA 203 and the package cover 208. The package substrate 202 may include conductive features disposed in or on the rigid material that electrically couple the ICA 203 to a system panel, such as the PCB 102.

The ICA 203 typically includes a semiconductor device, here device 204, and a cold plate 206 bonded to the device 204. Here, the device 204 includes an active side 218 that includes device components, e.g., transistors, resistors, and capacitors, formed thereon or therein, and a non-active side, here the device backside 220, opposite the active side 218. As shown, the active side 218 is positioned adjacent to and facing towards the package substrate 202. The active side 218 may be electrically connected to the package substrate 202 by use of conductive bumps 219, which are encapsulated by a first underfill layer 221 disposed between the device 204 and the package substrate 202. The first underfill layer 221 may comprise a cured polymer resin or epoxy, which provides mechanical support to the conductive bumps 219 and protects against thermal fatigue.

The cold plate 206 generally includes a patterned side that faces towards the device 204 and an opposite side that faces towards the package cover 208. The patterned side includes a device facing cavity comprising a base surface 209, sidewalls 211 that surround the base surface 209, and a plurality of support features 224 disposed inwardly of the sidewalls 211. For example, the support features 224 may include protruding features extending away from the base surface 209. In some embodiments, the support features 224 may comprise protruding features having a width that traverses along the base surface 209. For example, one or more of the support features 224 may extend from a first opening of the inlet/outlet openings 212 to a second opening of the inlet/outlet openings 212 (e.g., starting from proximate to the right side of the left opening 212 and ending from proximate to the left side of the right opening 212). When attached to the device 204 disposed therebelow, the base surface 209 forms the upper surface of a coolant channel 210, the sidewalls 211 form an inner perimeter of the coolant channel 210, and the device backside 220 forms the bottom of the coolant channel 210. Thus, the device backside 220 is in direct thermal contact with coolant flowed therethrough. Generally, the support features 224 extend from the base surface 209 to a bonding interface with the device backside 220. The support features 224 provide structural support to the ICA 203 and disrupt laminar fluid flow at the interface of the coolant and the device backside 220 resulting in increased heat transfer therebetween.

Here, coolant is circulated through the coolant channel 210 through openings disposed through the cold plate 206, shown here as openings 206A disposed between the downwardly facing base surface 209 and an opposite upwardly facing surface. The openings 206A are in fluid communication with the inlet/outlet openings 212 of the package cover 208 through openings 222A formed in the sealing material layer 222 disposed therebetween.

As described in the methods below, in some embodiments, the cold plate 206 may be patterned using an anisotropic etch process that causes surfaces of the sidewalls and the support features 224 to slope, e.g., to form an angle of less than 90° with the bonding surface of the device 204. The anisotropic etch process causes the support features 224 to have a trapezoidal shape in cross section where each of the support features 224 is wider at the base surface 209 than at its interface with the device 204. Similarly, the sidewalls slope away from the base surface 209 and are wider at their base than at the interface with the device 204.

The sloped surface desirably increases the stability of the sidewalls 211 and support features 224 during manufacturing of the ICA 203. The added stability allows for the width of the field surfaces of the sidewalls 211 to be narrower, and the coolant channels to be deeper, when compared to cold plates having orthogonal surfaces, as narrow features at the base may undesirably buckle and break as the aspect ratio (height to width ratio) thereof is increased.

Here, the cold plate 206 is directly bonded to the device backside 220, i.e., attached to the device backside 220 without the use of an intervening adhesive material and the cold plate 206 the device backside 220 are in direct thermal contact. The package cover 208 generally comprises one or more vertical or sloped sidewall portions 208A and a lateral portion 208B that spans and connects the sidewall portions 208A. The sidewall portions 208A extend upwardly from a peripheral surface of the package substrate 202 to surround the device 204 and the cold plate 206 disposed thereon. The lateral portion 208B is disposed over the cold plate 206 and is typically spaced apart from the cold plate 206 by a gap corresponding to the thickness of the sealing material layer 222. Coolant is circulated through the coolant channel 210 through the inlet/outlet openings 212 formed through the lateral portion 208B. In each of the embodiments described herein, coolant lines 108 may be attached to the device package 201 by use of connector features formed in the package cover 208, such as threads formed in the sidewalls of the inlet/outlet openings 212 and/or protruding features 214 that surround the openings 212 and extend upwardly from a surface of the lateral portion 208B.

Typically, the package cover 208 is formed of semi-rigid or rigid material so that at least a portion of the downward force exerted on the package cover 208 by the mounting frame 106 (FIG. 2) is transferred to the supporting surface of the package substrate 202 and not transferred to the cold plate 206 and the device 204 therebelow. In some embodiments, the package cover 208 is formed of a thermally conductive metal, such as aluminum or copper. In some embodiments, the package cover 208 functions as a heat spreader that redistributes heat from one or more electronic components within a multi-component device package, such as described below.

The sealing material layer 222 forms an impermeable barrier between the ICA 203 and the package cover 208 that prevents coolant from reaching the active side 218 of the device 204 and causing damage thereto. In some embodiments, the sealing material layer 222 comprises a polymer or epoxy material that extends upwardly from the package substrate 202 to encapsulate and/or surround at least a portion of the device 204. In other embodiments, the sealing material layer 222 may be disposed between only the upward facing surface of the cold plate 206 and the portion of the package cover 208 disposed thereover. In some embodiments, the sealing material layer is formed from a molding compound, e.g., a thermoset resin, that when polymerized, forms a hermetic seal between the package cover 208 and the cold plate 206. Here, coolant is delivered to the cold plate 206 through openings 222A disposed through the sealing material layer 222. As shown, the openings 222A are respectively in registration and fluid communication with the inlet/outlet openings 212 of the package cover 208 thereabove and the inlet/outlet openings 206A in the cold plate 206 therebelow. Typically, coolant lines 108 are attached to the device package 201 by use of connector features formed in the package cover 208, such as threads formed in the sidewalls of the inlet/outlet openings 212 and/or protruding features 214 that surround the inlet/outlet openings 212 and extend upwardly from the surface of the lateral portion 208B.

Beneficially, the sealing material layer 222 provides mechanical support that improves system reliability and extends the useful lifetime of the device package 201. For example, the sealing material layer 222 may reduce mechanical stresses that can weaken interfacial bonds and/or electrical connections between electrical components of the device package 201, such as stresses caused by vibrations, mechanical and thermal shocks, and/or fatigue caused by repeated thermal cycles. In some embodiments, the sealing material layer 222 may be a thermally conductive material, such as a polymer or epoxy having one or more thermally conductive additives, such as solder (e.g., In), silver, graphite, and/or other forms of carbon (e.g., graphene or carbon nanoparticles). In some embodiments, the device package 201 further includes a support member 207 attached to the upward-facing side of the cold plate 206, the support member 207 may be formed of a rigid material, e.g., a metal or ceramic plate, that provides mechanical support to the cold plate 206. The support member 207 may be attached to the cold plate 206 using a direct bonding method or by use of an intervening adhesive layer (not shown).

Figure 3:
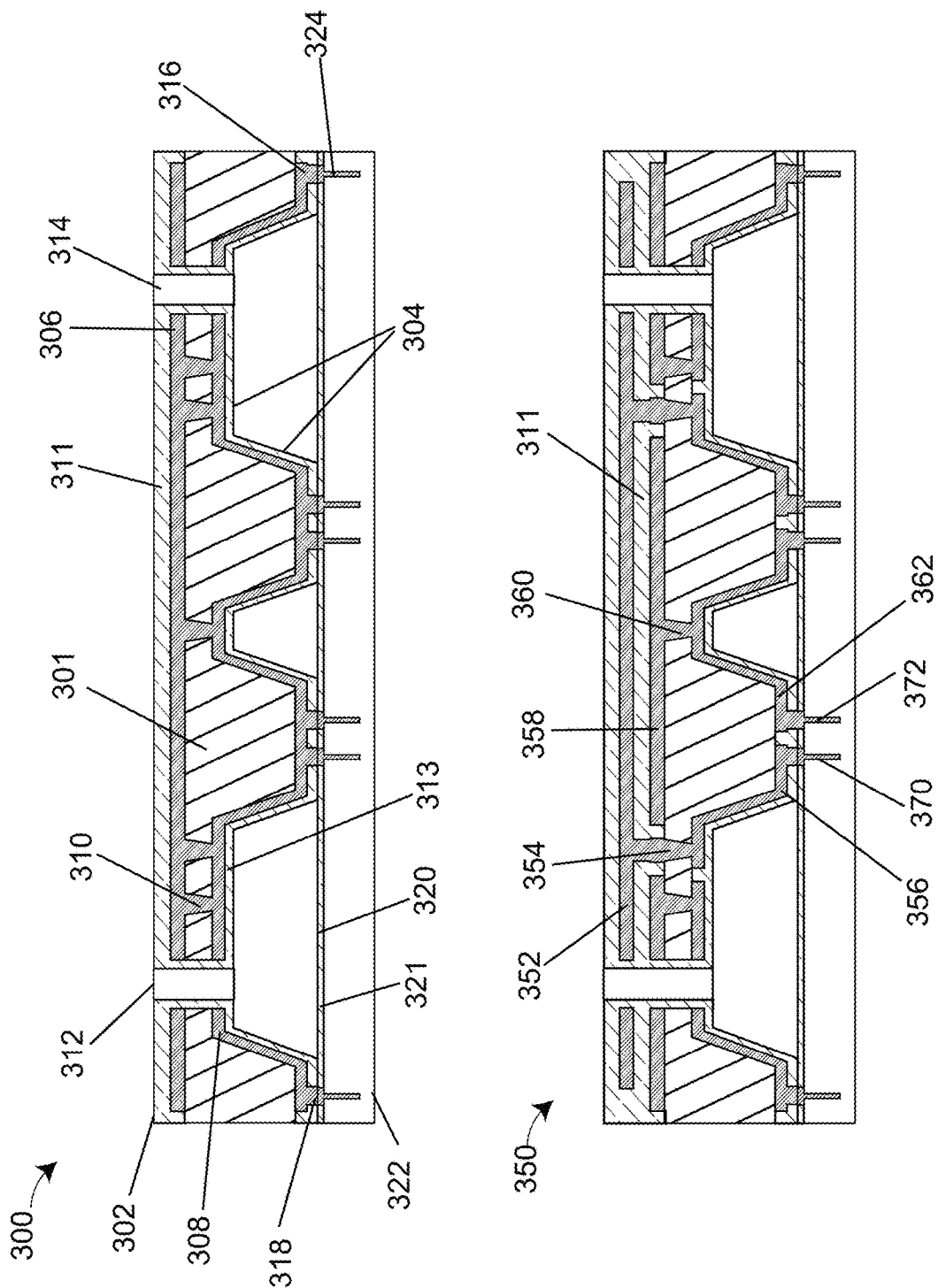
FIG. 3 shows schematic sectional views of integrated cooling assemblies having a power/ground delivery network, in accordance with some embodiments of the present disclosure.

FIG. 3 shows schematic sectional views of ICAs 300, 350 having a power/ground delivery network, in accordance with some embodiments of the present disclosure. The ICAs 300, 350 comprise a cold plate attached to a device having a coolant channel defined therebetween as described regarding FIGS. 1A-2B. For example, the ICAs 300 may include the device 204 and the cold plate 206. The cold plate may comprise a substrate, a first side, a second side, one or more conductive layers at each of the first and second sides, thru-substrate vias (TSVs) interconnecting the conductive layers, a dielectric layer, and one or more conductive pads at the side facing the device. The conductive layers, the TSVs, and the conductive pads herein may be collectively referred to as a delivery network, a power network, a power/ground delivery network, a ground network, a backside delivery network, and the like. In some embodiments, the conductive layers may be extended around support features of the cold plate and/or along the sidewalls of the support features. In some embodiments, the various parts of the cold plate may comprise materials having a low coefficient of thermal expansion (CTE).

In some embodiments, the delivery network may be a continuous delivery network. Additionally, or alternatively, the delivery network may comprise separate network sections. Some network sections may be interconnected while remaining electrically disconnected from other network sections. For example, a first network section may be used for delivering power and a second network section may be used to provide ground. Each of the first network section and the second network section may comprise respective conductive layers, TSVs, conductive pads, etc. that are electrically separate from the other network section. It is contemplated that the network sections and parts thereof may be arranged in various configurations. As an illustrative example, some delivery networks may be coupled to power and some delivery networks may be coupled to ground. For example, a row of delivery networks may be alternately coupled to power and ground. For example, in a top-down view, an inner section may comprise a first delivery network and an outer section (e.g., a ring) around the inner section may comprise a second delivery network. In this example, the inner section and outer section may be separated by a nonconductive material disposed therebetween. Some example configurations are described regarding FIGS. 3-6.

Each of the ICAs 300, 350 comprises a delivery network as part of the cold plate. The delivery network may enable an ICA to deliver power or provide ground via the backside of a device package. For example, a conductive line (e.g., power and/or ground line attachments) may be connected to the conductive layer at the backside of the ICA through a side of the assembly or disposed along a side of the device. It is noted that the conductive layer at the backside of the ICA can be coupled with an external source in various ways and the examples described herein are intended to be non-limiting. The conductive layer at the backside of the ICA may include a coating that is resistant to degradation and oxidation. The coating may be formed on the conductive layer prior to coupling with an external source. For example, the coating may be formed using electroless plating, sputtering, etc. Some example materials may include a Ni-based alloy such as Ni—P, NiV, and/or NiW. In some embodiments, the coating may comprise a thin dielectric layer (e.g., an oxide layer) over the conductive layer. The coating may thinly cover the conductive layer to protect the conductive layer from external exposure without contributing significantly to the total thickness of the ICA. For example, the coating may be between 1-10% of the ICA's thickness.

The device may comprise a device side 320 facing the cold plate, a device side 322, and a plurality of device vias 324. For example, the device side 320 may be a backside of the device, and the device side 322 may be a frontside of the device opposite to the device side 320. The device side 320 may be a non-active side of the device such as the non-active side 220 of the device 204. The device side 320 may include a protective coating or layer 321 exposed in the coolant channel. In various embodiments, the layer material type may be a dielectric and may thus be referred to as a dielectric layer or coating. The protective coating or layer 321 may comprise the same material or have the same material type as a dielectric layer 313 at a first side 304 of the cold plate. For example, the dielectric layers 313, 321 on respective sides 304, 320 may be dielectric layers of different thicknesses. The dielectric layers may be referred to as dielectric layers for illustrative purposes with respect to FIGS. 3-7 and are intended to be non-limiting examples. The device side 322 may be an active side of the device such as the active side 218 of the device 204. The device side 322 may be electrically connected to a package substrate (e.g., the package substrate 202), a second device, and/or a back-end-of-line (BEOL) layer using various connector types including, for example, bumps, interconnects, vias, pads, wires, etc. The device vias 324 start from the device side 320 and may connect the cold plate to the device. For example, the device vias 324 may include backside vias of the device. In some embodiments, the device vias 324 may include blind vias that stop before reaching the device side 322 as shown in FIG. 3. In some embodiments, the device vias 324 may be thru vias that end at the device side 322, for example, connecting with a second device at the opposite side of a first device. The device vias 324 at the device side 320 electrically couple the device and the delivery network of the cold plate as described in the following paragraphs.

In the ICA 300, the cold plate may comprise a substrate 301, a side 302, a side 304, conductive layers 306, 308 at the respective sides 302, 304, thru-substrate vias (TSVs) 310, dielectric layers 311, 313 on the respective conductive layers 306, 308, and conductive pads 316. The TSVs 310 electrically couple the conductive layers 306 and 308. The conductive pads 316 are disposed through the dielectric layer 313, electrically coupling the conductive layer 308 and the device. The dielectric layers 313, 321 may comprise a material resistant to damage from a coolant. In some embodiments, one or more of the dielectric layers 311, 313, 321 may comprise an oxide or nitride material. In some embodiments, one or more of the dielectric layers 311, 313, 321 may comprise a first dielectric material and a corrosion-resistant coating on the dielectric material. For example, dielectric layer 311 may comprise a protective coating to protect against the exterior environment. Some example materials for the dielectric layers 311, 313, 321 include oxides and/or nitrides of silicon and aluminum, such as silicon oxide, silicon nitride, silicon oxynitride, aluminum oxide, and combinations thereof.

In one embodiment, the conductive pads 316 are connected to opposing pads at the device (e.g., at ends of the device vias 324). The conductive pads 316 may be directly bonded to the device vias 324 at a bonding interface 318. In some embodiments, the cold plate may be bonded to the device via hybrid bonding at and around the bonding interface 318. The hybrid bonding may form a plurality of connections between the delivery network of the cold plate and the device. For example, the hybrid bonding may electrically couple one or more pads of the conductive layer 308 to the device vias 324. For example, the cold plate may comprise support features (e.g., support features 224) that protrude and contact with the device side 320. The conductive pads 316 may be at the base of the support features to form the bonding interface 318. The base of each of the support features and the conductive pads 316 may be hybrid-bonded to corresponding portions at the device side 320. Each of the conductive layers may have a thickness of at least 0.5 μm and may be up to 20 μm thick. In some embodiments, the conductive layers may have a thickness within a range of about 3-4 μm. The conductive layers and/or portions thereof may have different thicknesses. For example, the conductive layer 308 may be about 4.4 μm thick and the conductive layer 306 may be about 3 to 10 μm thick.

The cold plate may include inlet/outlet openings such as openings 312, 314 in the ICA 300. The openings 312, 314 may be similar to the inlet/outlet openings 212. For example, the opening 312 may be attached to a coolant inlet line and the opening 314 may be attached to a coolant outlet line. It is contemplated that the openings may have various inlet/outlet configurations and arrangements for circulating coolant through the coolant channel (e.g., coolant channel 210).

In some embodiments, the substrate 301 may act as a base layer to support formation of a delivery network. The substrate 301 has a first side and a second side, which are respectively used to form the sides 302, 304. The substrate 301 may comprise a dielectric or insulating material (e.g., structural Si, glass, polysilicon, boron-silicon, and/or engineered polymers, such as reinforced polymers). For example, the second side of the substrate 301 may be patterned using an anisotropic etching process to form support features having a trapezoidal shape in cross section (e.g., support features 224). It is noted and appreciated that the prior example is intended to be non-limiting and that the support features may have any shape in cross section (e.g., rectangular, ellipsoidal, etc.) without departing from the teachings of the present disclosure. For example, the support features 224 may have a rectangular shape in a first cross section (e.g., along the line A-A') and a trapezoidal shape in a second cross section (e.g., the sidewalls of support features 224 facing the X-axis). Conformal and/or nonconformal deposition techniques may be used to form subsequent layers on the substrate 301. For example, the layer 311 may be a conformal coating. For example, the conductive layer 308 may be by depositing a conformal or nonconformal metal layer on the second side of the substrate 301. In embodiments where the substrate 301 and/or supporting features comprise a low thermal conductivity (TC) material, the conductive layers may enhance thermal dissipation.

Openings in the substrate 301 (or TSV openings for brevity) may be formed using any suitable technique (e.g., drilling, etching, etc.), which define the parameters (shapes, sizes, etc.) and arrangement of TSVs 310. The conductive layers of the cold plate may be deposited on the substrate 301 or portions thereof. In some embodiments, the conductive layers 306, 308, and the TSVs 310 may be formed from the same conductive process over one or more process phases. In some embodiments, one or more barrier/adhesion layers (not shown) may be deposited before depositing the conductive layers. In some embodiments, a seed layer may be formed on the barrier/adhesion layer(s) and the conductive layers 306, 308 and 310 plated from a suitable electroplating or electroless plating bath. In one embodiment, one or more of layers 306, 308 and 310 are plated, for example, via an electroplating bath comprising super-leveling additives (additives inducing bottom-up metal growth). After the electrodeposition of the conductive layers, the conductive layers may be annealed at temperatures below 180° C. for example, to stabilize the microstructure of the coated layer. The conductive layer 306 may planarized to remove a selected portion. In some embodiments, the conductive layers 306, 308, and 310 may be formed via 3D printing techniques, for example, by use of printed nanoparticles of selected conductive metals. The printed conductive layer may be annealed at a temperature sufficient to extract and/or substantially remove impurities (e.g., compounding additives used in the printing process) and densify the conductive layer. The formed conductive layer may be planarized to remove one or more portions. In some applications, the one or more portions may be removed by etching methods (e.g., wet etching).

The TSVs between may have a width between about 10 μm and about 300 μm. In some embodiments, the TSVs have a width between about 50 μm and about 100 μm. Any number of TSVs may be included between conductive layers as part of a delivery network. It should be noted that the TSVs 310 having sloped sides are provided for illustrative purposes. It is contemplated that the TSVs may have different parameters and arrangements than described herein without departing from the teachings of the present disclosure. For example, the TSVs may have vertical sides in cross section. For example, the TSVs may have hexagonal-shaped ends in a top-down view. For example, the TSVs may have varying dimensions (e.g., heights, widths, etc.). For example, in a top-down view, the TSVs may be arranged in a grid, a star, concentric circles, and other patterns or combinations thereof. In some embodiments, the TSVs may be partially filled. Stress from the TSVs may be reduced in this manner that may otherwise result from a conductive layer with sufficient thickness to fill the TSVs. In one non-limiting example, the TSVs may comprise a conformal coating of the TSV sidewalls. In some embodiments, one or more of the TSVs 310 may comprise a first portion and a conductive layer around the first portion. For example, the first portion may comprise a material different from the conductive layer such as a dielectric, an insulator, and/or a filler material. The conductive layer may be disposed between the first portion and the substrate 301. In such an embodiment, the conductive layer may electrically couple the conductive layers 306, 308.

The ICA 350 may provide a configuration for more than one delivery networks. The ICA 350 may be advantageous, in some aspects, by providing a power and a ground to neighboring device regions or the same device region. The ICA 350 comprises conductive layers 352, 356, 358, 362 and vias 354, 360. In some embodiments, the conductive layers 356 and 362 comprise portions of a single conductive layer that has been patterned so that the portions are electrically decoupled or isolated from one another. As shown, the conductive layers 352, 358 are electrically decoupled or isolated from one another by portions of the layer 311 disposed therebetween. For example, the layer 311 may comprise SiO$_2$ or another Si-based compound.

The conductive layer 352 is connected to the conductive layer 356 using the vias 354, forming a first delivery network. In a similar manner, the conductive layer 358 is connected to the conductive layer 362 using the vias 360, forming a second delivery network. In particular, the conductive layer 362 may extend along neighboring support features of the cold plate to connect the second delivery network with the device vias at the respective bases of the neighboring support features. The first and second delivery networks may be coupled with the device using conductive pads connected to respective device vias 370, 372. For example, the first delivery network may be used for delivering power to the device through the corresponding device vias including the device via 370. For example, the second delivery network may provide ground through the device via 372. In the ICA 350, the conductive layers 356 and 362 may be separated by a portion such as a dielectric layer disposed on the side 304. It is contemplated that multiple delivery networks may be coupled with the same device region. For example, a plurality of delivery networks may be configured for delivering a particular amount of power and/or to provide a particular voltage to the device region. Each of the plurality of the power delivery networks may deliver a portion of the power to the same device region. The ICA 350 may be an example of such a configuration. As an illustrative example, a device region may require 1.4 V. Three delivery networks may be coupled with the device region, collectively providing at least 1.4 V.

Figure 4:
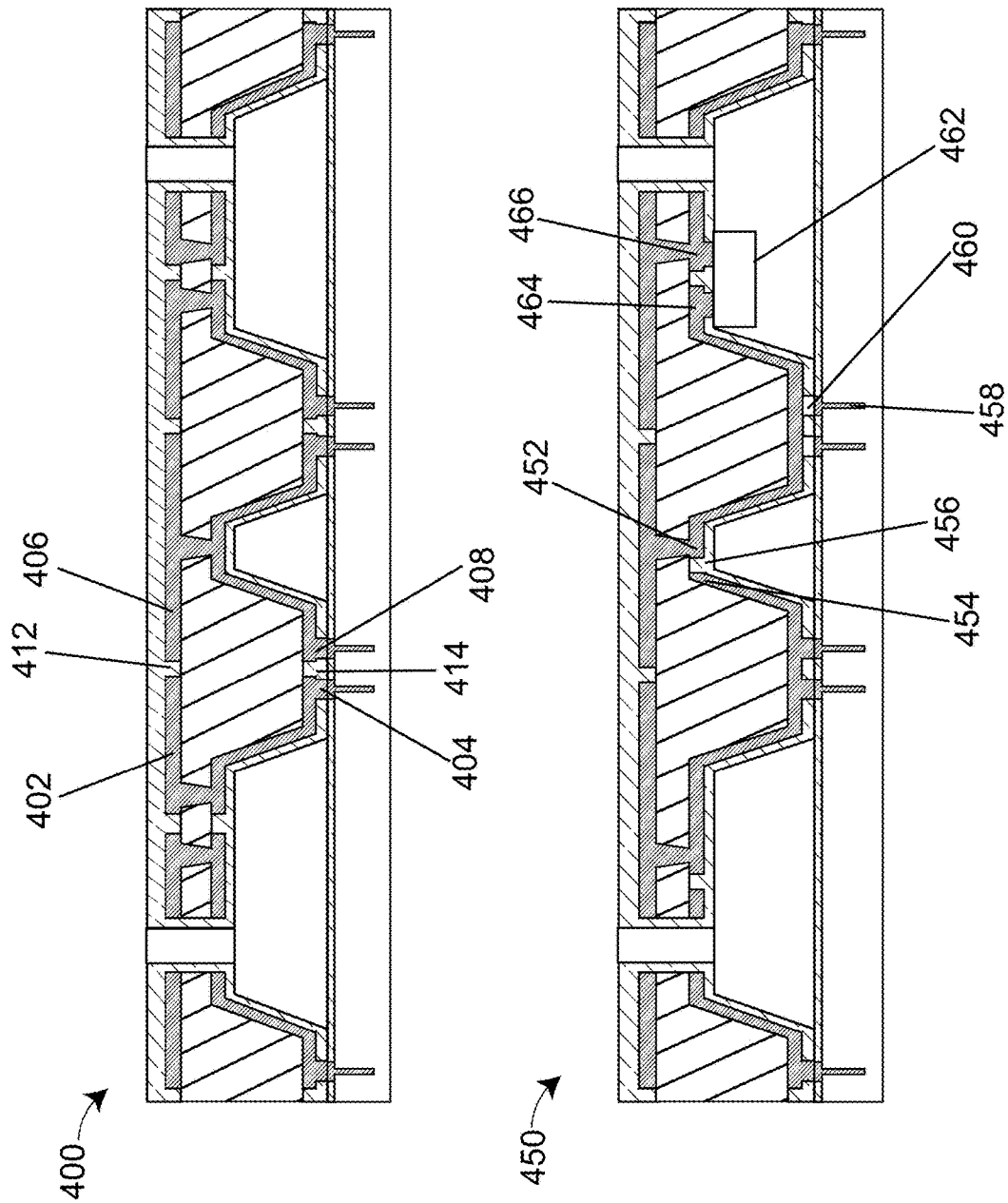
FIG. 4 shows schematic sectional views of integrated cooling assemblies having a cold plate with laterally adjacent metallization layers, in accordance with some embodiments of the present disclosure.

FIG. 4 shows schematic sectional views of ICAs 400, 450 having a cold plate with laterally adjacent conductive layers, in accordance with some embodiments of the present disclosure. In the ICA 400, the cold plate may comprise conductive layers 402, 406 separated by a portion 412. The conductive layer 402 may include a section that is disposed on the same side as a section of conductive layer 406. In the ICA 400, the sections are laterally adjacent and separated by the portion 412. In some embodiments, the conductive layers 402, 406 are formed from the conductive layer 306, 308, for example, by etching to form separate sections disposed on the substrate 301. A dielectric layer may be deposited in gaps between the sections. The cold plate may comprise conductive pads 404 and 408 respectively connected to the device in a similar manner as described regarding the ICA 450. The respective sections including the conductive pads 404 and 408 may be separated by a portion 414. In the ICA 400, the conductive layer 402 and the conductive pad 404 may form a first delivery network. Similarly, the conductive layer 406 and the conductive pad 408 may form a second delivery network. The first and second delivery networks may connect with neighboring device vias on the backside of the device in this configuration. The ICA 400 may be advantageous, in some aspects, by providing a power and a ground to neighboring device regions or the same device region in a similar manner to the ICA 350.

The ICA 450 provides a configuration having multiple delivery networks. In the ICA 450, the cold plate may comprise a first delivery network having a section 452 of a conductive layer. As an example, the section 452 may be extended to follow the sidewalls of a support feature of the cold plate. The section 452 may be separated from a section 454 of a second delivery network of the cold plate by a portion 456. The delivery networks may be selectively connected to the device vias. In the ICA 450, the section 454 may be electrically connected to a plurality of device vias on the backside of the device while the section 452 is separated from the devices vias 458 by a separator 460 disposed therebetween. In some embodiments, the section 452 may be connected to a device 462, for example, at a conductive pad 464. For example, the device 462 may include a passive component or another circuit component. For example, the device 462 may be a chiplet. The device 462 may be attached to the base surface of the cold plate in the coolant channel. In such embodiments, the device 462 is connected to a section 466 of another delivery network. For example, the section 452 may provide power to the device 462 and the section 466 may provide ground to the device 462. The device 462 may include a dielectric coating. The dielectric coating comprises a material that would protect against damage from coolant in the coolant channel.

Figure 5:
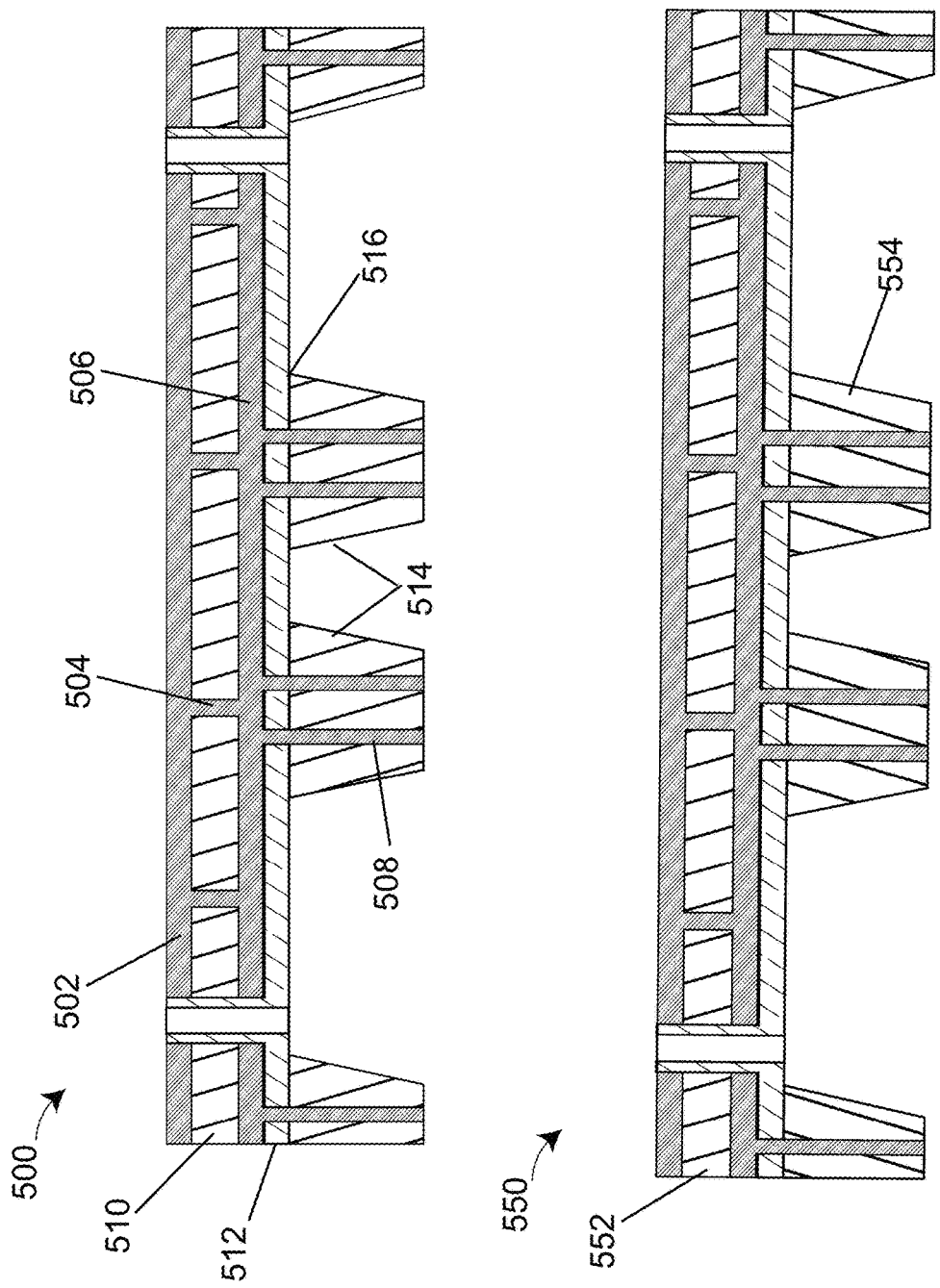
FIG. 5 shows schematic sectional views of cold plates in which the cold plate is assembled using an upper portion and a lower portion, in accordance with some embodiments of the present disclosure.

FIG. 5 shows schematic sectional views of cold plates 500, 550 in which the cold plate is assembled using an upper portion and a lower portion, in accordance with some embodiments of the present disclosure. The cold plate 500 may comprise a delivery network as described herein. In particular, the delivery network comprises conductive layers 502, 506 and vias 504, 508. The cold plate 500 comprises a substrate 510, a dielectric layer 512, and support features 514. The upper portion of the cold plate 500 may comprise the conductive layers 502, 506, the vias 504, the substrate 510, and the dielectric layer 512. The lower portion of the cold plate 500 may be collectively defined by the support features 514. In the cold plate 500, the substrate 510 may comprise a first material and the support features 514 may comprise the same first material. The upper portion and the lower portion of the cold plate 500 may be prepared separately and assembled to form the cold plate 500 in some embodiments as described in the following paragraphs. For example, the upper portion of the cold plate 500 may be formed using similar techniques as applied to form the cold plate in the ICA 300.

The support features 514 may be formed starting with a second substrate (not shown). For example, the support features 514 may be formed by etching the second substrate. The vias 508 may be formed through the support features 514. A side of the support features 514 may be planarized and prepared for attaching to the upper portion of the cold plate. The support features 514 are attached to the upper portion of the cold plate at sites 516. In some embodiments, the vias 508 may be formed in the support features prior to attaching to the upper portion. For example, the support features 514 may be attached to the side of the cold plate facing the device. In some embodiments, the support features 514 may be directly bonded to the sites 516, for example, using a direct dielectric bonding technique at the sites 516. It is noted that the sites 516 illustrate one configuration. It is contemplated that the support features 514 may be attached in various arrangements to form a patterned side of the cold plate, for example, as in the cold plate 206. In some embodiments, one or more of the TSVs 508 are formed as a blind TSV in the substrate 510, extending inwardly from the front side. The overburden of conductive material used to fill the TSV openings may be removed by planarization methods. The TSV 508 is revealed from the backside of the substrate. The revealing process may comprise of thinning, polishing, etching, and dielectric coating operations on the substrate 510 from the backside. The dielectric layer 512 may be formed during the revealing of TSV 508 from the backside of the substrate 510. Conductive layer 506 may be formed over the dielectric layer 512. Dielectric layer 510 is formed over the conductive layer 506, and layer 510 may be patterned to form via cavities for conductive via 504. Conductive via 504 and conductive layer 502 may be formed sequentially or by a conductive layer coating operation such as dual damascene metal plating operation. Portions of conductive layer 502 may be selectively removed by planarization methods. Coolant cavities may be formed from the front side of the substrate by wet etch or dry etch methods using dielectric layer 512 as an etch stop, to form support features 514.

The vias 504 electrically connect the layer 502 to the layer 506. The vias 508 electrically couple the layer 506 to the base of the support features 514. In some embodiments, the conductive layer 506 includes conductive segments extending through the dielectric layer 512 to connect with the vias 508 in the support features 514. Additionally, or alternatively, the vias 508 may extend past the base surface of the cold plate and through the dielectric layer 512 to connect with the conductive layer 506. The vias 508 may connect the delivery network to a device in a similar manner as the conductive pads (e.g., the pads 316, 404, 408).

The cold plate 550 may be formed in a similar manner as described regarding the cold plate 500. In particular, the cold plate 550 comprises a substrate 552 and support features 554. In the cold plate 550, the substrate 552 may comprise a first material suitable for structural support (e.g., structural Si, glass, etc.). The support features 554 may comprise a second material different from the first material. For example, the substrate 552 may comprise bulk Si and the support features 554 may be formed from glass. The cold plate 550 may provide an illustrative example of a cold plate having mixed materials for structural support. In some advantageous aspects, the substrate 552 and/or the support features 554 comprising an insulating material (e.g., glass) may be inexpensive and may result in reduced intervening layers. For example, glass support features would not need an insulating or barrier layer. For example, a glass substrate may support conductive layers without an intervening barrier layer.

Figure 6:
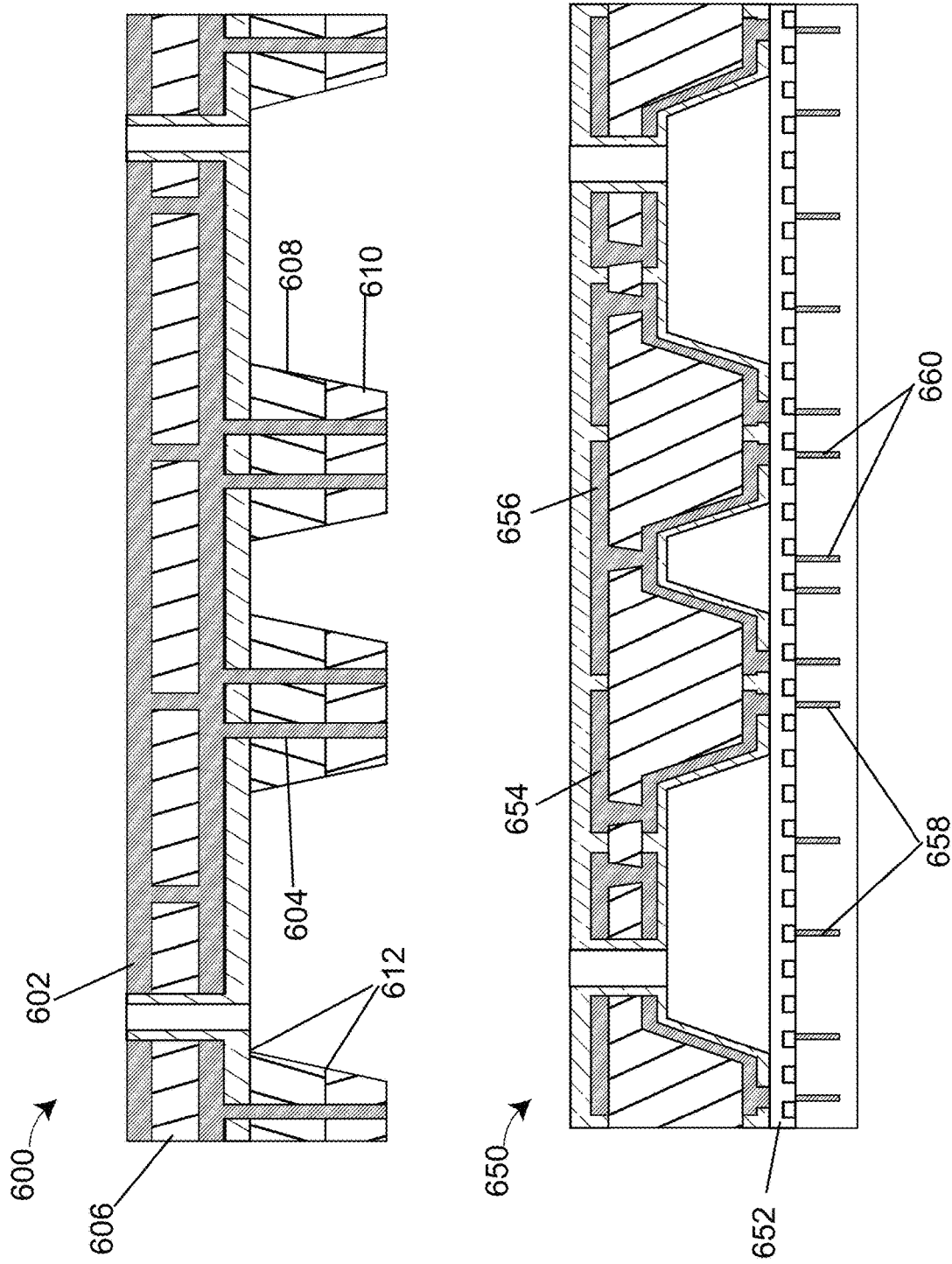
FIG. 6 shows schematic sectional views of some configurations of power/ground delivery networks, in accordance with some embodiments of the present disclosure.

FIG. 6 shows schematic sectional views of some configurations of power/ground delivery networks, in accordance with some embodiments of the present disclosure. FIG. 6 includes a cold plate 600 and an ICA 650. The cold plate 600 comprises the delivery network 602, a substrate 606, and support features. The delivery network 602 may include vias 604. The cold plate 600 may have an upper portion and a lower portion substantially similar to the cold plates 500, 550. The cold plate 600 or portions thereof may be formed using similar techniques as described regarding the cold plates 500, 550.

In some embodiments, the support features may comprise two or more portions. Additionally, or alternatively, the portions of the support features may comprise different materials. As an illustrative example in the cold plate 600, the support features include a first portion 608 and a second portion 610. The vias 604 may extend through the portions 608, 610 and end at the base of the support features to connect with a device side. The support features may include sites 612 adhering the first portion 608 to the second portion 610 and/or adhering the first portion 608 to the base surface of the cold plate. In the cold plate 600, the first portion 608 comprises a material different from the substrate 606 and/or different from the second portion 610. For example, the substrate 606 may comprise structural Si, the first portion 608 may comprise glass, and the second portion 610 may comprise structural Si or a third material. In some advantageous aspects, the second portion 610 may have a higher TC than the first portion 608. The higher TC material may encourage distribution of a localized hot spot at site of contact with the device to areas more accessible by a coolant, thus enhancing the cooling efficiency.

TSVs in the cold plates 500, 550, and 600 may extend through their respective support features. Additionally, or alternatively, a conductive layer may extend around the support features and/or along the sidewalls, for example, as described regarding FIGS. 3-4. For example, a conductive layer such as the layer 356 may be used in the cold plate 600 instead of the TSVs 604.

In some embodiments, the delivery network may connect to a device using a redistribution layer (RDL) or an interposer disposed between the cold plate and the device. As an illustrative example, the ICA 650 comprises a device, a RDL 652 on the device, and a cold plate (e.g., as described in the ICA 400) on the RDL 652. The device may comprise device vias 658, 660 connected to different points of the RDL 652. The cold plate comprises first section 654 and second section 656 at the side of the cold plate facing away from the device. The first section 654 may provide power and the second section 656 may provide ground (e.g., by connecting the sections to respective sources). The RDL 652 may couple the power/ground sections to various parts of the device. For example, in one configuration, the first section 654 delivers power to the RDL 652. The RDL 652 may distribute the delivered power to the device vias 658. The second section 656 provides ground and the RDL 652 connects the ground to the devices vias 660. In some advantageous aspects, the ICA 650 enables the delivery network sections to electrically couple with any part of the device backside in flexible configurations using the RDL 652. For example, the RDL 652 may provide an interconnect pitch not exceeding 5 µm for the delivery network. In some embodiments, the interconnect pitch may be less than or equal to 2 µm. In some embodiments, the RDL may comprise various passive components (e.g., massive capacitors). It is contemplated that an RDL may be included in any of the embodiments described herein without departing from the teachings of the present disclosure.

While a RDL and/or interposer is described herein, it is contemplated that this intervening layer may be a layer for enabling hybrid bonding in the ICA and is intended to be non-limiting. In particular, the intervening layer may allow for hybrid bonding in some embodiments. For example, referring to the ICA 650, the substrate and/or supporting features may comprise glass or another insulating material. In some embodiments, an adhesion coating may be applied to support attaching the cold plate to the device. For example, a dielectric layer may be deposited to support direct dielectric bonding. Alternatively, the intervening layer (e.g., RDL 652) may provide a bonding interface suitable for hybrid bonding. For example, the intervening layer may join the cold plate and the device via hybrid-bonding.

Figure 7:
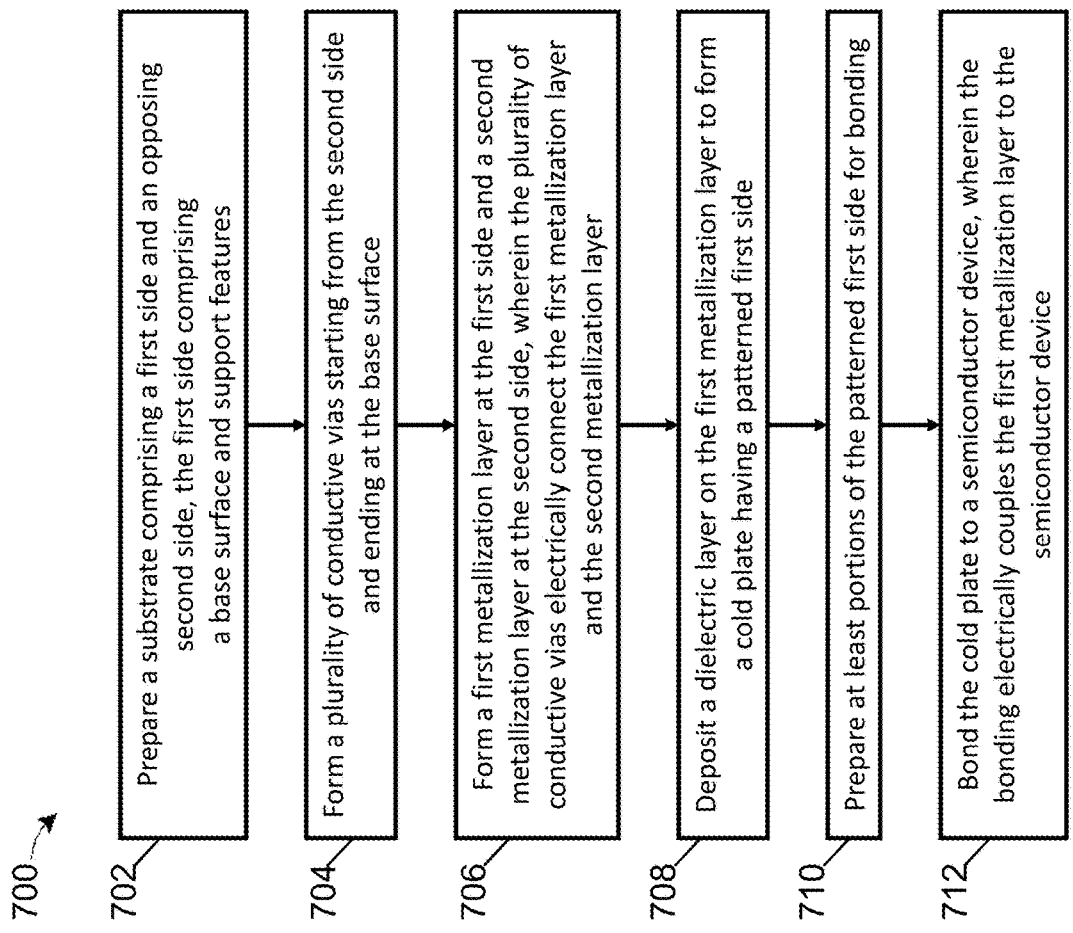
FIG. 7 shows an exemplary process that that may be applied for manufacturing one or more integrated cooling assemblies as described in various embodiments of the present disclosure.

FIG. 7 shows an exemplary process 700 that may be applied for manufacturing one or more ICAs as described in various embodiments of the present disclosure. At 702, a substrate is prepared having a first side and a second side opposite to the first side. For example, the substrate may be prepared (e.g., etched, planarized, etc.) for supporting formation of a cold plate comprising a delivery network. The first side may comprise a base side and support features. The first side may be used to define a patterned side when forming the cold plate. In particular, the base side may define a base surface of the cold plate. The patterned side may be oriented to face a device side when attaching the cold plate to the device side. The second side may be used to define a second side of the cold plate such as a backside facing away from the device. In some embodiments, the support features may extend from the base side (e.g., support features 514).

At 704, a plurality of conductive vias is formed in the substrate, starting from the second side of the substrate and ending at the base side. In some embodiments, some of the conductive vias may extend through the support features. At 706, first and second conductive layers are formed at the respective first and second sides of the substrate (e.g., using a deposition and/or conductive technique). The first and second conductive layers are connected by the conductive vias. In particular, the conductive layers may be connected by the plurality of conductive vias which start at the second side and end at the base side. In some embodiments, sections of the conductive layers may be disposed at portions of the second side to form laterally adjacent metallized sections on the same side (e.g., the conductive layers 402, 406). A section on the second side may be connected to a corresponding section on the first side to form a delivery network as described regarding FIGS. 3-4.

In some embodiments, a dielectric layer may be deposited over the second conductive layer. A third conductive layer may be formed on the dielectric layer. Conductive vias may be extended and/or formed that connect the third conductive layer to some of the conductive vias in the substrate. Such a process may enable forming the layers 352, 358 having the portions of layer 311 disposed therebetween, resulting in the ICA 350 having the first and second delivery networks. Alternatively, a structure may be formed on a second substrate, where the structure comprises the conductive layer 352, the portions of layer 311, and the conductive layer 358. The structure may be disposed on the substrate 301 having the conductive vias to assemble the cold plate of the ICA 350.

At 708, a dielectric layer is deposited on the first conductive layer and/or the first side of the substrate, which may form a cold plate having a patterned first side. The dielectric layer may comprise a dielectric, an insulating material, etc. The patterned first side may comprise a base surface and sidewalls of the support features, which collectively define a coolant channel between the cold plate and the device. In particular, the dielectric layer may comprise a coating for preventing damage that would otherwise be caused by interaction with a coolant. The first conductive layer may include conductive pads (e.g., pads 316, 464). Portions of the dielectric layer may be planarized to expose the conductive pads. In particular, the dielectric layer may be level with the conductive pads.

At 710, at least portions of the patterned first side are prepared for bonding. A first plurality of the conductive pads may be disposed at the bottom of the support features. In particular, the bottom of the support features may be prepared to form a bonding interface with the device side. The bonding interface may include the dielectric layer and the conductive pads of the first conductive layer. At 712, the cold plate may be bonded to a semiconductor device, electrically coupling the first conductive layer to the semiconductor device. For example, the support features of the patterned first side may be bonded to a backside of the device at the bonding interface. When the patterned first side of the cold plate is bonded to the semiconductor device, a coolant channel may be defined therebetween by the base surface and/or support features. The bonding may involve hybrid bonding between the patterned first side and the device side. In some embodiments, a second plurality of the conductive pads may be disposed at the base surface (e.g., the pads 464). The second plurality of the conductive pads and portions of the patterned first side around the conductive pads may be prepared to attach a second device (e.g., the device 462). The process 700 describes a method for manufacturing the embodiments described in the present disclosure. It is contemplated that the embodiments described herein may be manufactured using various techniques, suitable substitutes of the described techniques, and/or combinations thereof without departing the teachings of the present disclosure.

The embodiments discussed above are intended to be illustrative and not limiting. One skilled in the art would appreciate that individual aspects of the cooling assemblies, device packages, manufacturing processes, and/or methods discussed herein may be omitted, modified, combined, and/or rearranged without departing from the scope of the present disclosure. Only the claims that follow are meant to set bounds as to what the present disclosure includes.

What is claimed is:

1. An integrated cooling assembly comprising:
   a device having an active side and a backside disposed opposite of the active side; and
   a cold plate having a first side and a second side opposite the first side, the first side having a recessed surface, sidewalls that surround the recessed surface and extend downwardly therefrom to define a cavity, and a plurality of support features disposed in the cavity, wherein the first side of the cold plate is attached to the backside of the device to define a coolant channel therebetween, the cold plate further comprising:
   a substrate having a first surface on the first side and a second surface opposite the first surface;
   a dielectric layer disposed on the first surface;
   a first conductive layer disposed between the first surface and the dielectric layer;
   a second conductive layer disposed on the second surface; and
   thru-substrate interconnects connecting the first conductive layer to the second conductive layer.

2. The integrated cooling assembly of claim 1, wherein a coefficient of thermal expansion (CTE) of the cold plate is about the same as a CTE of the device.

3. The integrated cooling assembly of claim 1, wherein the second conductive layer comprises a power plane or a ground plane.

4. The integrated cooling assembly of claim 1, wherein the cold plate is attached to the device by direct hybrid bonds formed therebetween, the device being electrically connected to the first conductive layer by the direct hybrid bonds.

5. The integrated cooling assembly of claim 1, wherein the plurality of support features and the sidewalls define a bonding interface with the device.

6. The integrated cooling assembly of claim 5, wherein the first conductive layer is electrically connected to the backside of the device through openings in the dielectric layer, and the openings are disposed between the support features and the backside of the device.

7. The integrated cooling assembly of claim 5, wherein:
   the cold plate further comprises a third conductive layer disposed over and electrically isolated from the second conductive layer,
   the first conductive layer comprises a first portion and a second portion electrically isolated from the first portion, and
   the first portion is electrically connected to the second conductive layer and the second portion is electrically connected to the third conductive layer through respective ones of the thru-substrate interconnects.

8. The integrated cooling assembly of claim 5, wherein:
   the second conductive layer comprises a power plane and a ground plane electrically isolated from the power plane;
   the first conductive layer comprises a first portion electrically connected to the power plane and a second portion electrically connected to the ground plane; and
   each of the first and second portions are disposed between one of the support features and the device and are electrically isolated from each other by a portion of the dielectric layer disposed therebetween.

9. The integrated cooling assembly of claim 5, wherein each of the plurality of support features is hybrid bonded to the device at the bonding interface.

10. The integrated cooling assembly of claim 5, wherein each of the plurality of support features is attached to the device by direct dielectric bonds.

11. The integrated cooling assembly of claim 1, wherein the substrate is a semiconductor substrate, and the integrated cooling assembly is disposed in a device package comprising:
   a package substrate having the device disposed thereon;
   a package cover disposed on the package substrate and extending over the cold plate and the device, the package cover having an inlet opening and an outlet opening disposed therethrough; and
   a material layer disposed between the package cover and the cold plate, wherein the coolant channel is in fluid communication with the inlet opening and the outlet opening.

12. The integrated cooling assembly of claim 1, wherein the backside of the device comprises a redistribution layer, and the redistribution layer comprises interconnections between the first conductive layer and circuitry on the active side of the device.

13. The integrated cooling assembly of claim 12, wherein the conductive layers and vias of the cold plate form a power/ground delivery network, the bonding comprises direct hybrid bonding, the direct hybrid bonding electrically couples the power/ground delivery network, and the conductive elements are disposed in, on, and/or through the backside of the device.

14. The integrated cooling assembly of claim 12, wherein the cold plate is directly bonded to the device without the use of an intervening adhesive.

15. An integrated cooling assembly comprising:
   a device having an active side and a backside disposed opposite of the active side; and
   a cold plate having a first side and a second side opposite the first side, the first side having a recessed surface, sidewalls that surround the recessed surface extending downwardly therefrom to define a cavity, and a plurality of support features disposed in the cavity, wherein the first side of the cold plate is attached to the backside of the device to define a coolant channel therebetween, the cold plate further comprising:
   a substrate having a first surface on the first side and a second surface opposite the first surface;
   a first dielectric layer disposed on the first surface;
   a first conductive layer disposed between at least a portion of the first surface and the first dielectric layer;
   a second conductive layer disposed on the first dielectric layer and over the first conductive layer;
   a second dielectric layer disposed on the second surface;
   a third conductive layer disposed between at least a portion of the second surface and the second dielectric layer;
   a fourth conductive layer disposed on the second dielectric layer and over the third conductive layer;
   one or more first thru-substrate interconnects connecting the first conductive layer to the third conductive layer; and one or more second thru-substrate interconnects connecting the second conductive layer to the fourth conductive layer.

16. The integrated cooling assembly of claim 15, wherein the conductive layers and vias of the cold plate form a power/ground delivery network, the bonding comprises direct hybrid bonding, the direct hybrid bonding electrically couples the power/ground delivery network, and the conductive elements are disposed in, on, and/or through the backside of the device.

17. The integrated cooling assembly of claim 15, wherein the cold plate is directly bonded to the device without the use of an intervening adhesive.

18. An integrated cooling assembly comprising:
a device having an active side and a backside disposed opposite of the active side; and
a cold plate having a first side and a second side opposite the first side, the first side having a recessed surface, sidewalls that surround the recessed surface extending downwardly therefrom to define a cavity, and a plurality of support features disposed in the cavity, wherein the first side of the cold plate is attached to the backside of the device to define a coolant channel therebetween, the cold plate further comprising:
a substrate having a first surface on the first side and a second surface opposite the first surface;
a dielectric layer disposed on the first surface;
a first conductive layer disposed between a first portion of the first surface and the dielectric layer;
a second conductive layer between a second portion of the first surface and the dielectric layer;
a third conductive layer disposed on a third portion of the second surface;
a fourth conductive layer disposed on a fourth portion of the second surface, wherein the third conductive layer and the fourth conductive layer are separate;
one or more first thru-substrate interconnects connecting the first conductive layer to the third conductive layer; and
one or more second thru-substrate interconnects connecting the second conductive layer to the fourth conductive layer.

19. The integrated cooling assembly of claim 18, wherein the conductive layers and vias of the cold plate form a power/ground delivery network, the bonding comprises direct hybrid bonding, the direct hybrid bonding electrically couples the power/ground delivery network, and the conductive elements are disposed in, on, and/or through the backside of the device.

20. The integrated cooling assembly of claim 18, wherein the cold plate is directly bonded to the device without the use of an intervening adhesive.

* * * * *